United States Patent [19]

Uesaka

[11] Patent Number: 5,600,472
[45] Date of Patent: Feb. 4, 1997

[54] DISTORTION GENERATING CIRCUIT

[75] Inventor: Katsumi Uesaka, Yokohama, Japan

[73] Assignee: Sumitomo Electric Industries, Ltd., Osaka, Japan

[21] Appl. No.: 226,852

[22] Filed: Apr. 13, 1994

[30] Foreign Application Priority Data

Apr. 14, 1993 [JP] Japan ................................ 5-087352
Nov. 18, 1993 [JP] Japan ................................ 5-289268

[51] Int. Cl.⁶ .................................................. H04B 10/00
[52] U.S. Cl. ........................ 359/161; 330/149; 333/81 R
[58] Field of Search ........................ 330/149; 359/161, 359/180, 187, 189, 188, 195; 333/81 R

[56] References Cited

U.S. PATENT DOCUMENTS

| 4,992,754 | 2/1991 | Blauvelt et al. | 330/149 |
| 5,119,392 | 6/1992 | Childs | 372/38 |
| 5,132,639 | 7/1992 | Blauvelt et al. | 330/149 |
| 5,172,068 | 12/1992 | Childs | 330/149 |
| 5,179,461 | 1/1993 | Blauvelt et al. | 359/189 |
| 5,262,741 | 11/1993 | Kitakubo | 333/81 R |

FOREIGN PATENT DOCUMENTS

| 0261813 | 3/1988 | European Pat. Off. | H03F 1/32 |
| 0407919 | 1/1991 | European Pat. Off. | H04B 10/18 |
| 0584013 | 2/1994 | European Pat. Off. | H04B 10/14 |
| 0600553 | 6/1994 | European Pat. Off. | H04B 10/14 |
| 2455395 | 12/1990 | France | 330/149 |
| 230192 | 8/1988 | Japan | G11B 33/02 |
| 1179807 | 9/1990 | Japan | H03C 1/02 |
| 4267574 | 11/1991 | Japan | H01S 3/103 |
| 6104658 | 4/1994 | Japan | 330/149 |

OTHER PUBLICATIONS

Textbook → 4th Edition Electronic Devices and Circuit Theory, Robert Boylestad, 1987, relevant p. 107.
Stewart et al, "Predistortion Linearisation of Amplifiers for UHF Mobile Radio", Proecedings of the European Microwave Conference, 1988, Sep. 12–16, 1988, pp. 1017–1022.
Gnauck et al., Comparison of Direct and External Modulation for CATV Lightwave Transmission At 1–5μ Wavelength, Electronic Letters, vol. 28, No. 20, Sep. 24, 1992, pp. 1875–1876.

*Primary Examiner*—Wellington Chin
*Assistant Examiner*—Rafael Bacares
*Attorney, Agent, or Firm*—Cushman Darby & Cushman, L.L.P.

[57] ABSTRACT

A distortion generating circuit of the present invention comprises a linear attenuator which has an input impedance substantially coincident with an impedance of a transmission path of input signal and an output impedance substantially coincident with an impedance of a transmission path of output signal; and at least one diode which is connected in an alternating current manner in parallel with the linear attenuator with respect to the input signal into the linear attenuator and which generates nonlinear distortion for a component in the input signal input thereinto; which outputs an AC sum of an output from the linear attenuator and an output from the diode. By this arrangement, desired distortion can be well given in a simple circuit arrangement while suppressing generation of unnecessary intermodulation distortion. An optical transmitter, an optical receiver or an amplifier can be constructed using the distortion generating circuit of the present invention, obtaining a signal with reduced distortion.

24 Claims, 31 Drawing Sheets

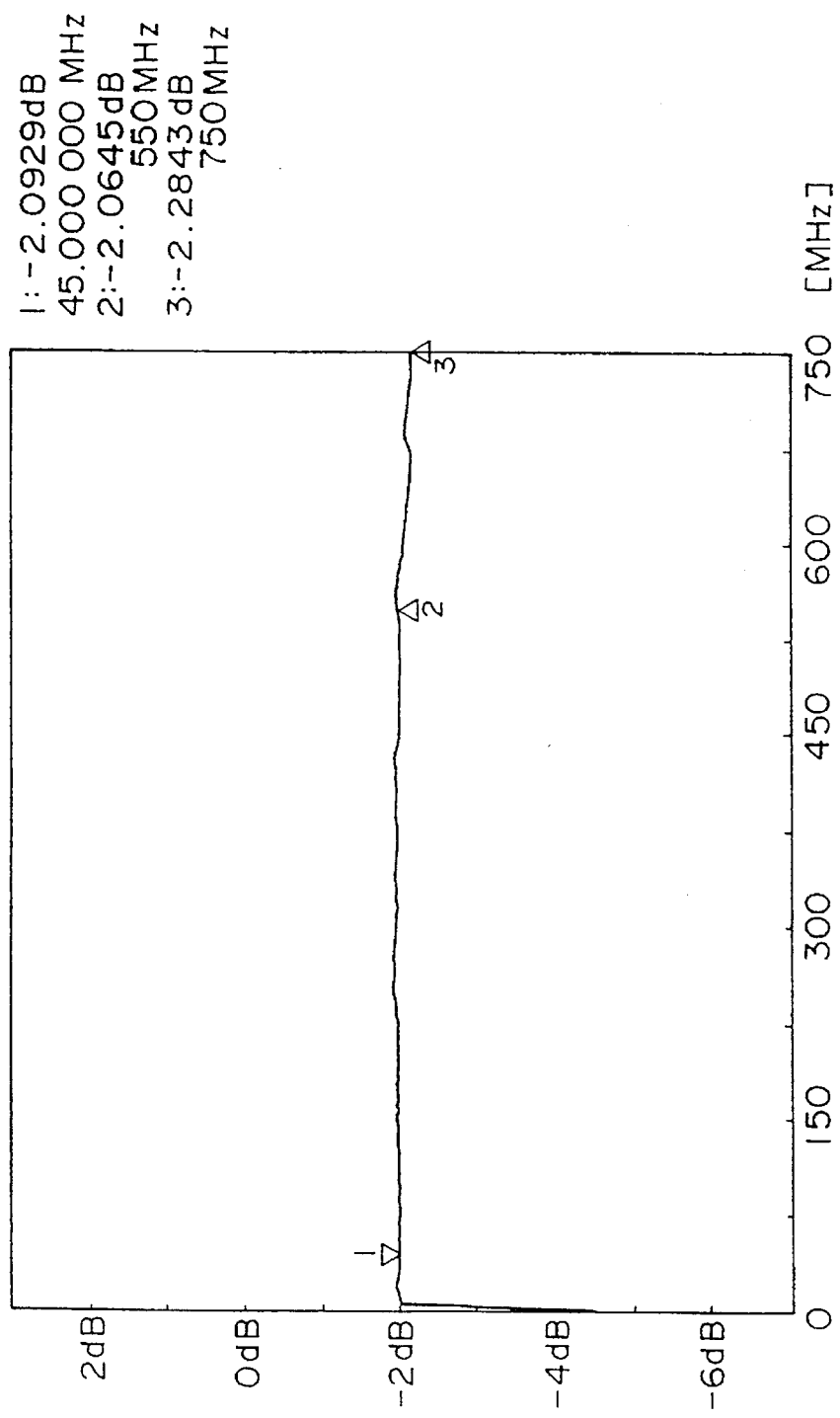

DISTORTION GENERATING CIRCUIT

BACKGROUND OF THE INVENTION

1. Field of the Invention

The present invention relates to a distortion generating circuit which provides distortion for canceling nonlinearity of input/output characteristics of a high-frequency signal output stage (for example a nonlinear device such as a nonlinear amplifier as an output stage in transmitter or a semiconductor laser) to linearize an analog signal output therefrom. More particularly, the invention relates to a distortion generating circuit suitable for multiple analog image transmission such as CATV.

2. Related Background Art

Conventionally, negative feedback is used to improve the linearity of an amplifier in the low frequency region. However, conventional systems do not normally use the negative feedback to improve the linearity of the amplifier in the high frequency region because of rotation of phase caused by a signal delay. Thus, when high linearity is required in a broad region, the linearity is normally improved using a circuit having input/output characteristics which cancel the nonlinearity (i.e., a distortion generating circuit). A distortion generating circuit is provided before an output stage or a semiconductor laser of a transmitter. It has a nonlinear element such as a diode or a transistor. Based on the circuit's nonlinearity, distortion is generated, that distortion being used to linearize an object circuit having nonlinearity. Specific examples are described for example in Japanese Utility Model Publication No. 2-30192 and ELECTRONICS LETTERS Vol. 28 No. 20, 1992, pp 1875–1876. The circuits as described in these references are arranged with two diodes, as nonlinear elements, which are connected opposite to each other with respect to a signal and which are operated as nonlinear elements at a predetermined bias point.

The multiple analog image transmission such as the CATV requires transfer characteristics of very low level distortion to obtain a high quality image. The distortion correcting circuit in multiple analog image transmission needs to have the following characteristics: (1) Independent correction of second order and third-order distortions components, which could cause a problem in analog image transmission; and (2) correction of the distortion while also compensating a frequency dependency of a nonlinear device, because wide band transmission is required. There are distortion correcting circuits developed for correcting the nonlinearity of a transmission device, which could be a cause to produce distortion in analog signal. For example, U.S. Pat. No. 4,992,754, U.S. Pat. No. 5,132,639 and U.S. Pat. No. 5,119,392 describe such circuits.

FIG. 1 diagrammatically shows a circuit as described in U.S. Pat. No. 4,992,754 and U.S. Pat. No. 5,132,639. This circuit is constructed in a so-called parallel circuit arrangement, where a signal to be supplied to a circuit 901 is split by a distributer 910 into two paths. A nonlinear device 915 is provided in one path, and a delay circuit (delay line) 925 is provided in the other path. Furthermore, two signals are combined in a coupler 911. This circuit has such an advantage that distortion components can have frequency characteristics without influencing a base signal and the frequency dependency of distortion of the nonlinear device can also be compensated.

SUMMARY OF THE INVENTION

A distortion generating circuit of the present invention is a distortion generating circuit for canceling nonlinearity of input/output characteristics of a high-frequency signal output stage. It is provided with a linear attenuator having matched input and output impedances and at least one diode connected in parallel with the linear attenuator. The diode provides a component in the input signal input to the linear attenuator with nonlinear distortion. A sum of an output from the linear attenuator and an output from the diode is then output.

The at least one diode comprises at least a pair of diodes connected in mutually opposite polarities with respect to the input signal into the linear attenuator. The distortion generating circuit can supply an output obtained by giving an odd-order distortion component to the input signal. It is here preferred that the paired diodes are adjustable in bias point independently of each other, or that they are connected in series with a bias power supply and are adjustable in bias point thereof at a time.

Also, the at least one diode may comprise one or more diodes for generating an even-order, substantially second-order or higher-order, distortion component for the input signal into the linear attenuator. The distortion generating circuit can supply an output obtained by giving the odd-order distortion to the input signal.

It is practical that the linear attenuator is constructed as to comprise a plurality of resistors. Part of the resistors in the linear attenuator can be used as part of bias circuits for the first and second diodes.

The bias points of the diodes may be independently adjustable or they may be simultaneously connected in a DC manner in series to the bias power source and adjustable An optical transmitter may be constructed of a distortion generating circuit of the present invention for giving a nonlinear distortion component to an input signal, and a light emitting element driven by an output signal from the distortion generating circuit. The transmitter may be so arranged as to have a first distortion generating circuit of the present invention supplying an output obtained by giving an odd-order distortion component to an input signal, a second distortion generating circuit of the present invention for receiving a signal output from the first distortion generating circuit and supplying an output obtained by giving an even-order distortion component to the signal, and a light emitting element driven by the signal output from the second distortion generating circuit.

An optical transmitter may be constructed of a distortion generating circuit of the present invention for receiving a modulation signal and providing the modulation signal with nonlinear distortion to output a resultant signal, and an optical modulator for modulating input light by the signal output from the distortion generating circuit to output modulated light. An optical transmitter can be so arranged as to have a first distortion generating circuit of the present invention for receiving a modulation signal and providing the modulation signal with odd-order distortion to output a resultant signal, a second distortion generating circuit of the present invention for receiving the signal output from said first distortion generating circuit and providing the signal with even-order distortion to output a resultant signal, and an optical modulator for modulating input light by the signal output from the second distortion generating circuit to output modulated light.

An optical receiver may be constructed of a light receiving element for receiving light to convert it into an electric signal, and a distortion generating circuit of the present invention for receiving the electric signal output from the light receiving element to give a nonlinear distortion component thereto. Here, it can be so arranged as to have a light receiving element for receiving light to convert it into an electric signal, a first distortion generating circuit of the present invention for receiving the electric signal output from the light receiving element and supplying an output obtained by giving an odd-order distortion component thereto, and a second distortion generating circuit of the present invention for receiving a signal output from the first distortion generating circuit and supplying an output obtained by giving an even-order distortion component to the signal.

A low-distortion amplifier may be constructed of a distortion generating circuit of the present invention for giving a nonlinear distortion component to an input signal, and an amplifier for receiving a signal output from the distortion generating circuit and amplifying it. Here, it can be so arranged as to have a first distortion generating circuit of the present invention for supplying an output obtained by giving an odd-order distortion component to an input signal, a second distortion generating circuit of the present invention for receiving a signal output from the first distortion generating circuit and supplying an output obtained by giving an even-order distortion component thereto, and an amplifier for receiving a signal output from the second distortion generating circuit to amplify it.

In the distortion generating circuit of the present invention, an input signal from the outside is split into two signals, which are supplied to the linear attenuator and to the diode, respectively. A signal passing through the diode is given a distortion component according to a bias point. The signal with distortion passing through the diode is added to the signal passing through the linear attenuator. The sum signal is output from the circuit. After the split input signal is let to pass through the linear attenuator, it is added to the signal from the diode and the sum signal is output, as described. This arrangement can prevent unnecessary intermodulation (cross modulation) distortion from appearing in the diode with input of large amplitude.

If the first and second diodes are connected in opposite polarities with respect to the input signal, they have nonlinear characteristics depending upon a bias point thereof, which are equivalently opposite in polarity to each other with respect to the input signal. Signals passing through the diodes are provided with respective distortion components depending upon the respective bias points of the first and second diodes, so that output signals have distortion components depending upon the respective nonlinear characteristics of the first and second diodes, which permits flexible distortion correction.

In case the linear attenuator is one composed of resistors, it is very excellent in return loss and frequency characteristics, and good impedance matching can be effected in a broad band. In case part of the resistors is arranged as part of the bias circuits for the first and second diodes, the circuit can be more simplified.

Also, if the bias points of diodes are adjustable independently of each other, the nonlinear characteristics of the first and second diodes can be independently adjusted. Then, the nonlinear characteristics of the diodes can be adjusted to be symmetric or asymmetric with respect to an input signal, which enhances the flexibility for provision of distortion. If they can be adjusted at the same time, the adjustment can be simpler.

In case at least one of the diodes is a pin diode, the minority carrier contributes to the operation of a junction diode (especially of the pin diode) used for band switch the like, whereby phase distortion becomes dominant in the generated distortion. Then, the high-frequency-range distortion becomes greater than the low-frequency-range distortion, so that the present distortion correcting circuit can correct distortion with frequency dependency.

If the circuit further has a capacitor connected in parallel with the diode, a part of the signal passing through the diode goes into the capacitor, through which high-frequency components pass. This can suppress high-frequency-range distortion, giving more flexibility for correction of distortion with frequency dependency.

If the diodes comprise a pin diode and a Schottky diode, the distortion is uniform in a broad band, because the majority carrier is dominant in the operation of Schottky barrier diode. Therefore, the correction of distortion with frequency dependency can be effected with more flexibility by using both the pin diode having large distortion in the high frequency region and the Schottky barrier diode having uniform distortion in a wide band.

Also, in case the distortion generating circuit of the present invention is used in combination with a light emitting element, a light receiving element, an optical modulator, or an amplifier, an output signal can be produced while reducing distortion generated by an input signal path or an employed active element in an optical transmitter, an optical receiver or a low-distortion amplifier.

The distortion generating circuit of the present invention can well provide desired distortion, because a signal of input with large amplitude is distributed to the attenuator and to the nonlinear element to prevent unnecessary cross modulation distortion from occurring. Especially, it can be achieved in a simple circuit arrangement, so that an excellent operation can be assured.

Also, a signal with reduced distortion can be attained by employing the distortion generating circuit of the present invention in an arrangement of optical transmitter, optical receiver or amplifier.

BRIEF DESCRIPTION OF THE DRAWINGS

FIG. 10 is a drawing to show frequency characteristics of the distortion generating circuit shown in FIG. 8;

DESCRIPTION OF THE PREFERRED EMBODIMENTS

The first embodiment of the present invention is first described with reference to the accompanying drawings.

Figure 1:
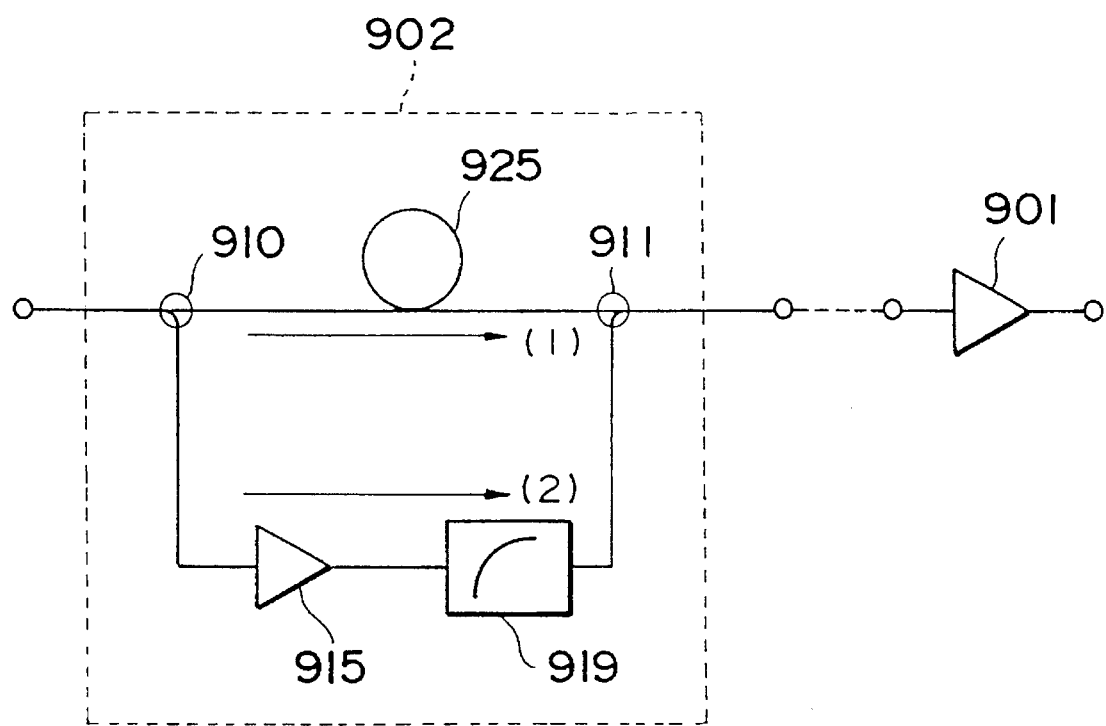
FIG. 1 is a scheme of a conventional example.
Figure 2:
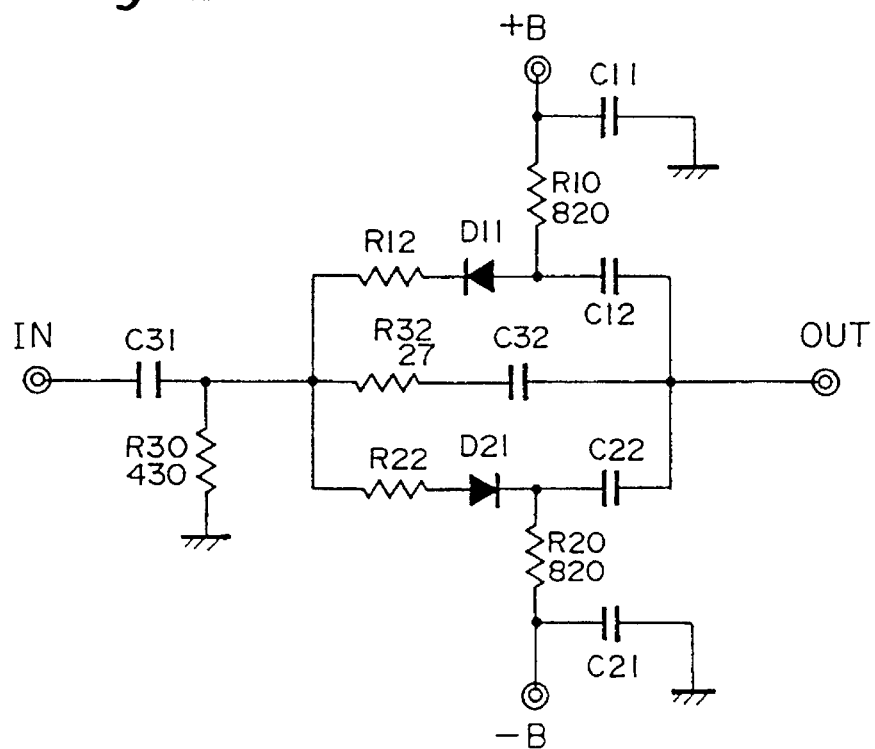
FIG. 2 is a circuit diagram to show an example of arrangement of a distortion generating circuit in a first embodiment.

FIG. 2 shows an example of a distortion generating circuit in the first embodiment. This distortion generating circuit is characterized in that two diodes are interposed to produce distortion, in opposite polarities to each other and in parallel to a resistor attenuator which is superior in return loss and frequency characteristics and which is matched in impedances of input and output.

The attenuator is a π attenuator composed of resistors R30, R32, R10 and R20, which is well matched in impedances as being input impedance Zi and output impedance Zo both of 75Ω and which is nearly constant in attenuation factor and in input/output impedances in a broad frequency region.

A diode D11 is connected to the attenuator in parallel and in an AC manner with respect to an input signal from an input terminal IN, a bias circuit for diode D11 is composed of resistors R10, R12 and R30, and a bias point is adjusted by a bias voltage +B. The diode is biased in a DC manner at a point where the current-voltage characteristics show nonlinearity, and a distortion component according to the bias point is given to a signal passing through the diode D11. Another diode D21 is connected to the attenuator in parallel and in an AC manner with respect to the input signal, and is connected to the diode D11 in an opposite polarity to that of the diode D11. A bias circuit for diode D21 is composed of resistors R20, R22 and R30 and a bias point thereof is adjusted by a bias voltage −B. The resistors R10, R20, R30 also function as part of the attenuator, whereby the circuit is simplified. Incidentally, both bias currents of the diodes D11, D21 flow through-the resistor R30. However, mutual influence can be negligible, because the resistance is low and the bias currents are small.

Capacitors C11, C21, C31, C32, C12, C22 cut a direct current but let an AC component pass therethrough. Signals passing through the diode D11, the diode D21 and the attenuator are combined with each other and a combined signal is output from an output terminal OUT to a next-stage circuit.

Figure 3:
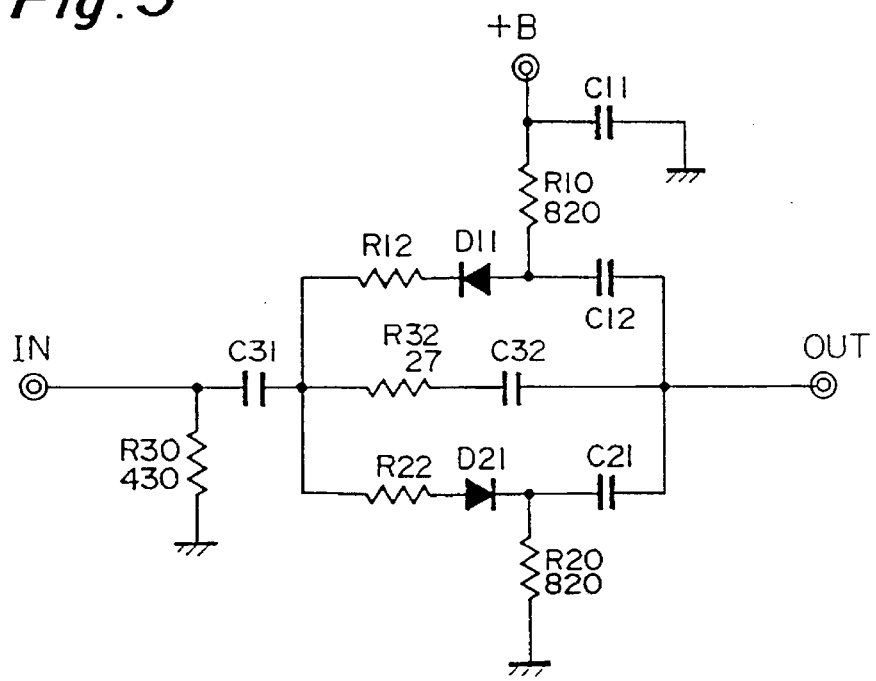
FIG. 3 is a circuit diagram to show an example of the arrangement of distortion generating circuit in the first embodiment.

FIG. 3 shows an example of arrangement in which only a single power supply is provided as a bias power source to the diodes D11, D21. The arrangement of FIG. 2 has such an advantage that the diodes D11, D21 can be adjusted in bias point independently of each other. In contrast, an arrangement of FIG. 3 has such an advantage that if the diodes D11, D21 are matched in characteristics the bias points thereof can be adjusted at a balanced state to ensure operation at a same bias point. The two arrangements are nearly identical except for the above point, both being arranged in a suitable manner for miniaturization.

Figure 4:
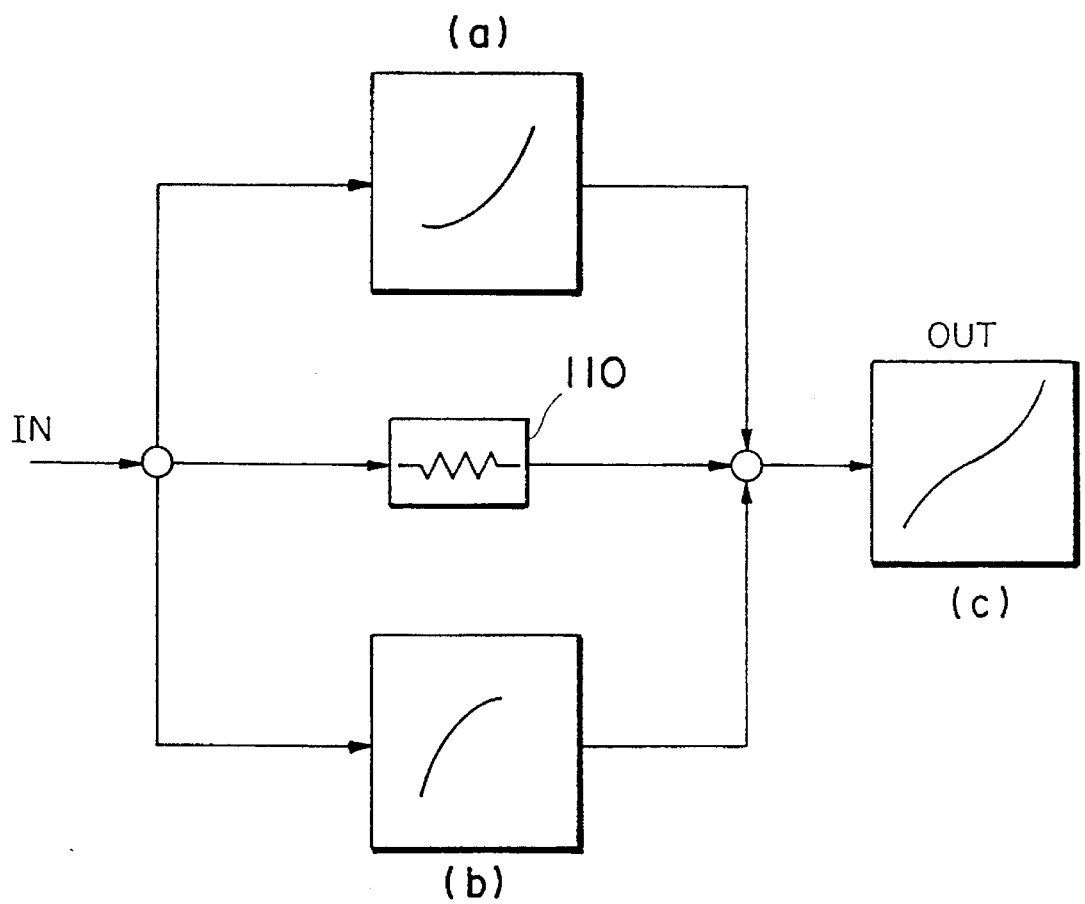
FIG. 4 is a diagrammatic illustration to show an operation of the distortion generating circuit in the first embodiment.

FIG. 4 is an equivalent circuit to summarize the operation of the distortion generating circuits as shown in FIG. 2 and in FIG. 3. The input signal into the input terminal IN is distributed to the diode D11, the diode D21 and the attenuator 110. The diodes D11, D21 provide the signals with respective distortion components depending upon the respective bias points. These diodes D11, D21 perform a so-called push-pull operation, because they are connected as opposite in polarity to each other. The signals passing through the diodes are added to the signal passing through the attenuator 110, and a sum signal is supplied to a next-stage circuit.

In FIG. 4, (a) shows a diagrammatic sketch of current-voltage characteristics on the diode D11 side, higher-order distortion components of that diode of differing relative to the bias point of the diode. The same is the case on the diode D21 side, but the transfer characteristic is different because of the opposite polarity in connection, at sketched as (b), clearly showing the difference. The signals from the diodes D11, D21 and the attenuator 110 are added to each other and a sum signal is output. This means that the characteristics of (a) and (b) in FIG. 4 are added to the linear characteristic of attenuator 110. Thus, the input/output characteristics of the distortion generating circuit in FIG. 2 can be diagrammatically shown by the characteristic of (c) in FIG. 4. Since the diodes each have a relatively large impedance and are arranged with the resistors R12, R22, respectively, the majority of base wave components are those passing through the attenuator 110. As described, the higher-order distortion components are given to the input signal and the distortion components may vary depending upon a change in bias points of the diodes.

In case of the arrangement in FIG. 2, the diodes D11, D21 are arranged to be adjusted in bias point independently of each other, so that the characteristics of (a) and (b) in FIG. 4 can be different from each other depending upon a difference of bias point. Thus, the characteristic of (c) in FIG. 4 will change depending upon the bias points of the diodes D11, D21. In case of the arrangement in FIG. 3, assuming the properties of diodes D11, D21 are identical, the characteristics of (a) and (b) in FIG. 4 are symmetric with each other. The characteristic of (c) in FIG. 4 changes the shape with a change in bias point but is kept in point symmetry. Namely, the arrangement of FIG. 3 is effective to give only an odd-order component.

Figure 5:
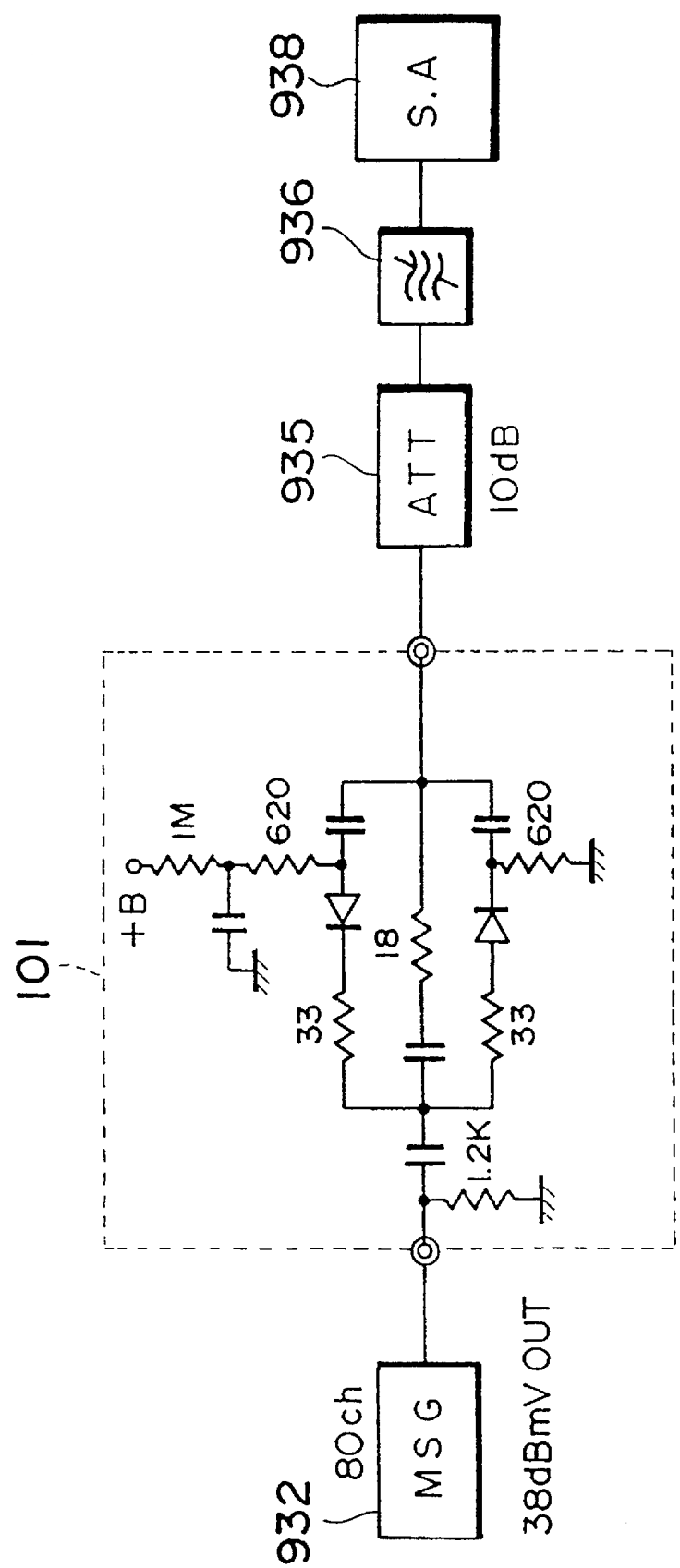
FIG. 5 is a drawing to show an example of arrangement of measuring system for distortion characteristics of the distortion generating circuit in the first embodiment.
Figure 6:
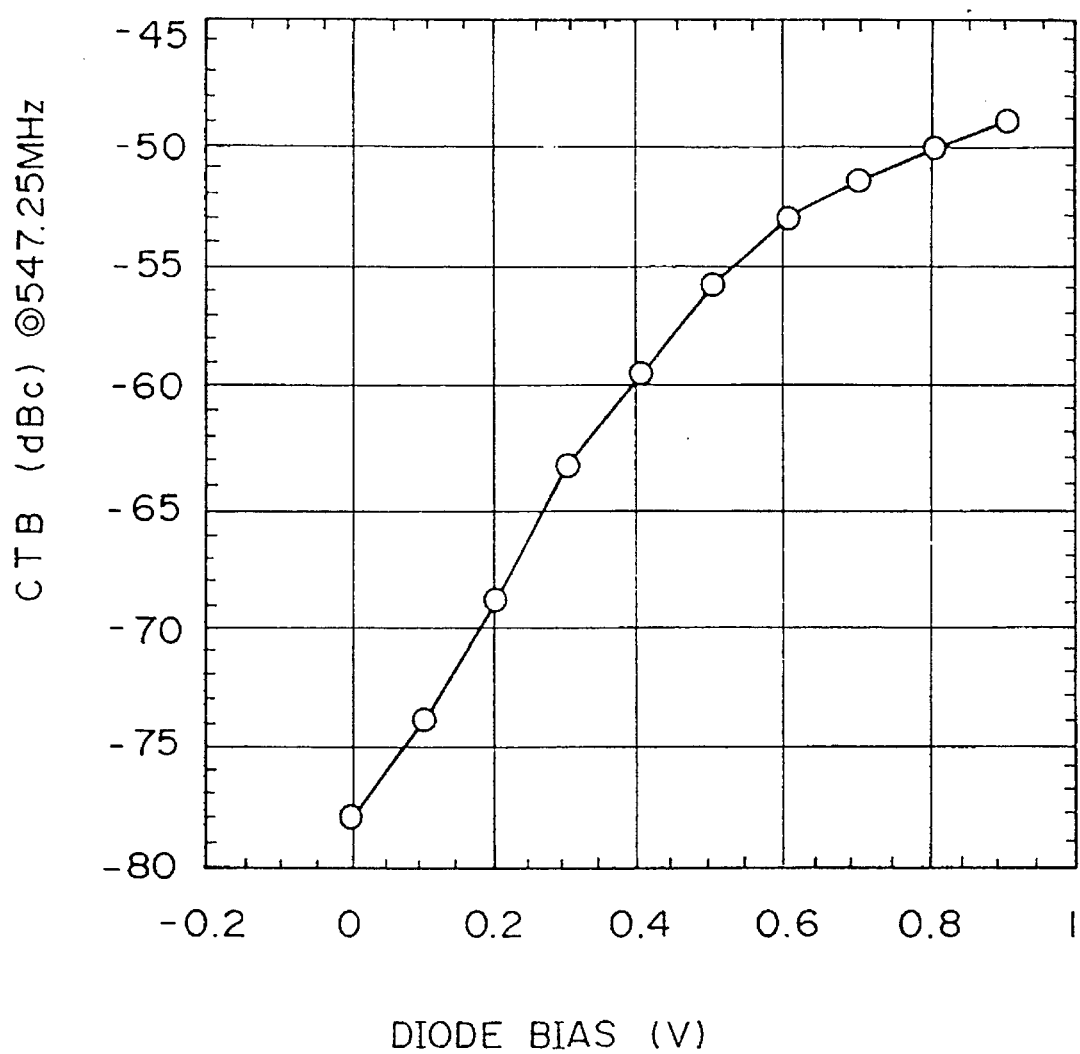
FIG. 6 is a drawing to show an example of third-order distortion measurement.

FIG. 5 shows a measurement system for measuring a third-order distortion component for a circuit 101 equivalent in structure to the circuit in FIG. 3. The measurement system is so arranged that a multi-channel signal generator (MSG) 932 supplies a signal of 80 ch and 38 dBmV, the circuit 101 gives distortion to the signal, the signal passes through an attenuator 935 and a band pass filter 936, and intermodulation (cross modulation) distortion is measured by a spectrum analyzer 938. The attenuator 935 is used to suppress a distortion due to reflection from the band pass filter so as to keep it constant at 10 dB (the band pass filter totally reflects components other than those in the passing region). FIG. 6 shows a measurement result of third-order distortion component at 547.25 MHz, from which it is clear that the intermodulation third-order distortion CTB changes with adjustment of bias point of the distortion generating circuit.

As described above, the diodes of opposite polarities are interposed in parallel with the attenuator 110 and the majority of fundamental wave components are those passing through the attenuator 110, so that the frequency characteristics of the nonlinear attenuator are mainly determined by the attenuator 110. Since the attenuator 110 is composed of the resistors, it can have flat frequency characteristics in a broad region and can be excellent in impedance matching. Thus, the return loss can be made small and the characteristics of the distortion generating circuit can be greatly improved. Also, an insertion loss is not influenced greatly by the bias points of diodes D11, D21, but is determined by an attenuation amount of the attenuator 110. Thus, the attenuation amount and the input and output impedances of attenuator 110 can be determined easily.

Further, with large amplitude input, unnecessary harmonic distortion can be prevented from being generated, because only a part of input signal passes through the diodes and the resistors R12, R22. Also, the attenuation amount of the attenuator 110 can be adjusted to match with an amount of the generated distortion and the amplitude of signal to be driven. In this case, constants of the attenuator 110 can be easily determined depending upon these conditions, so that the flexibility and the degree of freedom of circuit designing are both very high.

The above circuit arrangements can improve the characteristics in respect of the insertion loss, the frequency characteristics and a large signal operation, which have been desired to be improved for the conventional circuits. Especially, a high-frequency output can be obtained with high power and linearity in communications requiring a broad band, for example in the frequency multiplexing communication or CATV, enabling long-distance transmission with less relays.

Various modifications can be possible for the first embodiment.

Figure 7:
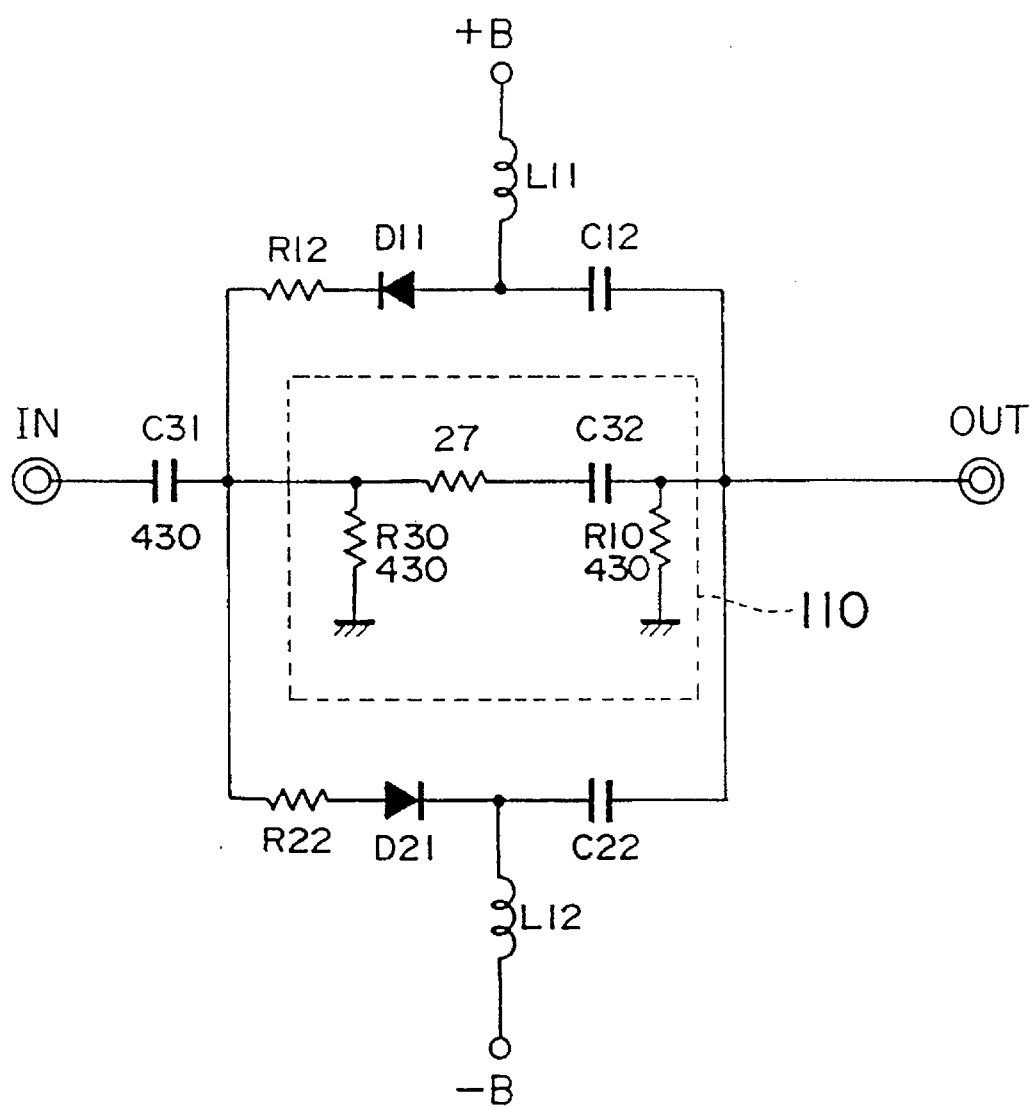
FIG. 7 is a circuit diagram to show an example of arrangement of distortion generating circuit in the first embodiment.

For example, another circuit arrangement may be as shown in FIG. 7 with the basic operation shown in FIG. 4, so that the attenuator 110 may be not only of the π type as shown in FIG. 2 or 3 but also of a T type. In FIG. 7, L11, L12 denote choke coils for blocking a signal. Also, these may be so arranged to adjust the bias points at the same time as shown in FIG. 3. The attenuator is constructed of resistors in order to make the frequency characteristics flat in this modification, but an attenuator may be constructed of a combination of capacitors and coils to have a frequency dependency in another modification.

Next described are the second embodiment of the present invention and modifications thereof.

Figure 8:
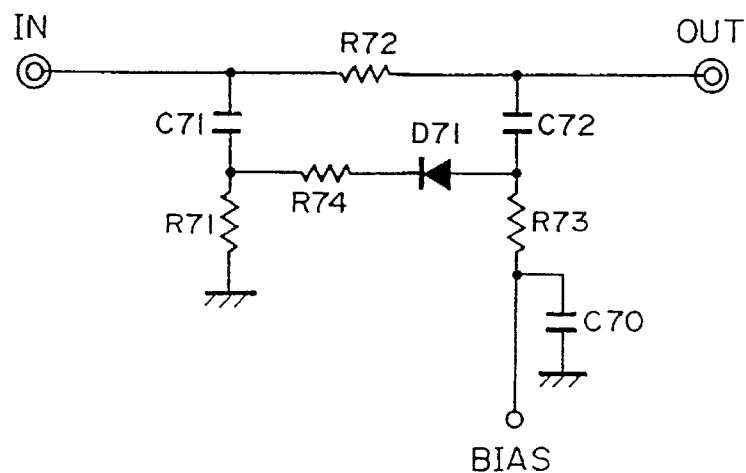
FIG. 8 is a circuit diagram to show an example of arrangement of distortion generating circuit in a second embodiment.

FIG. 8 shows a most fundamental constitutional example of the second embodiment according to the present invention. This circuit in FIG. 8 is characterized in that the circuit is composed of an attenuator composed of resistors R71, R72, R73, and a diode D71 (e.g., pin diode) connected in an AC manner in parallel to the attenuator with respect to an input signal. Capacitors C70, C71, C72 are provided for blocking a direct current and are adjusted to have a sufficiently small impedance to an input signal. A resistor R74 is provided for adjusting an operating point (intercept point) of diode D71 to an input signal, and the intercept point is set by a bias from the outside. The circuit generates distortion of desired amplitude to effect distortion correction (wherein the resistors R71, R73 serve as a bias circuit for the diode D71).

Figure 9:
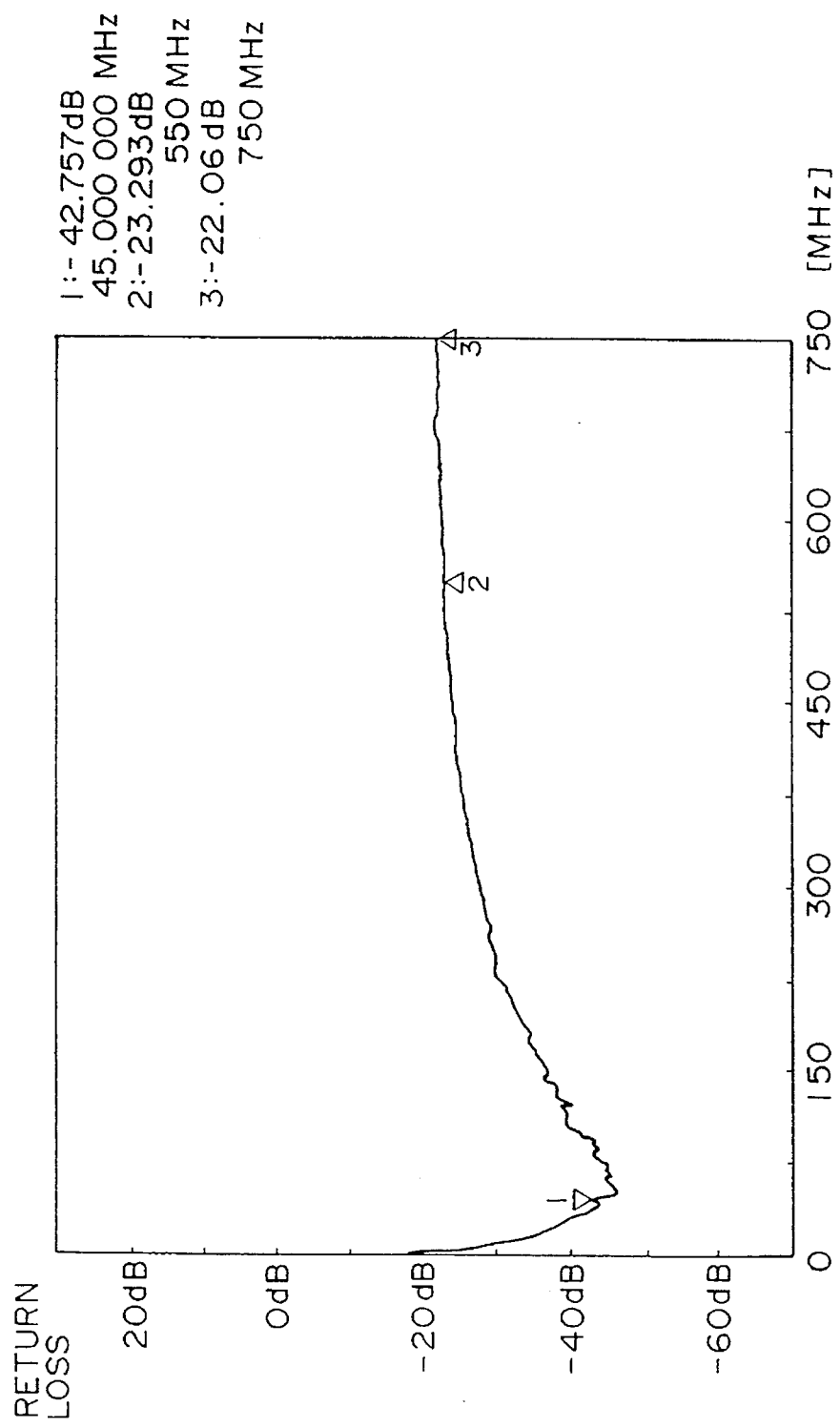
FIG. 9 is a drawing to show frequency characteristics of the distortion generating circuit shown in FIG. 8.
Figure 11A:
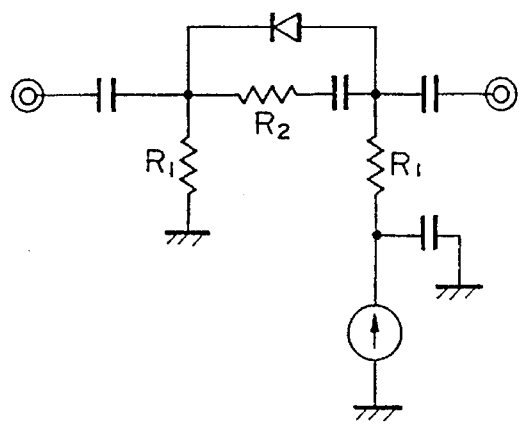
FIGS. 11A, 11B and 11C are circuit illustrations to show examples of arrangement of distortion generating circuit in the second embodiment.
Figure 11B:
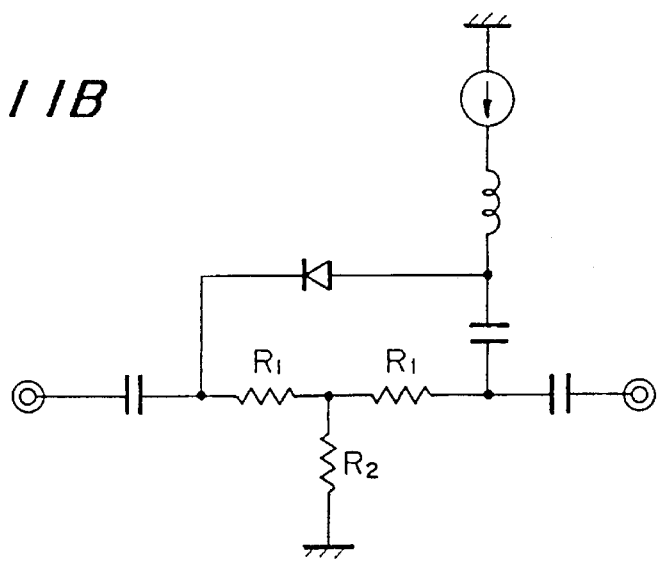
Figure 11C:
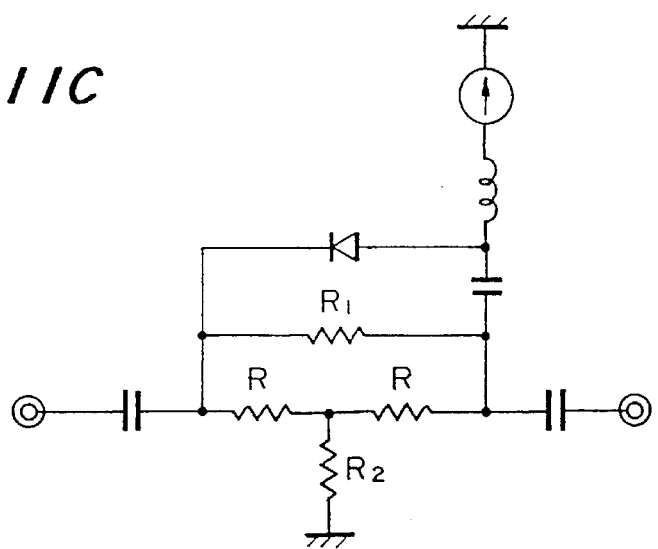

Supposing, as a specific example of constants of this circuit, the diode D71 is 1SS241 (manufactured by TOSHIBA), the resistors R71, R73 each have a resistance of 620Ω, the resistor R72 a resistance of 18Ω, the resistor R74 a resistance of 47Ω, and the capacitors C70, C71, C72 each a capacitance of 0.01 μF, a resultant distortion correcting circuit can be constructed with input/output impedance Z0 of 75Ω. FIG. 9 and FIG. 10 show frequency characteristics of the distortion correcting circuit in this arrangement. FIGS. 11A–11C show examples of arrangement of distortion generating circuit using a K attenuator or a T attenuator. In FIGS. 11A–11C, $Z_0$ is a characteristic impedance and A is an attenuation factor. In FIG. 11A, $R_1=Z_0*(1-A)/(1+A)$ and $R_2=Z_0*(1-A^2)/2A$. In FIG. 11B, $R_1=Z_0*(1+A)/(1-A)$ and $R_2 Z_0*2A/(1-A^2)$. In FIG. 11C, $R=Z_0$, $R_1=Z_0*(1-A)/(A)$ and $R_2=Z_0*A/(1-A)$.

Figure 12:
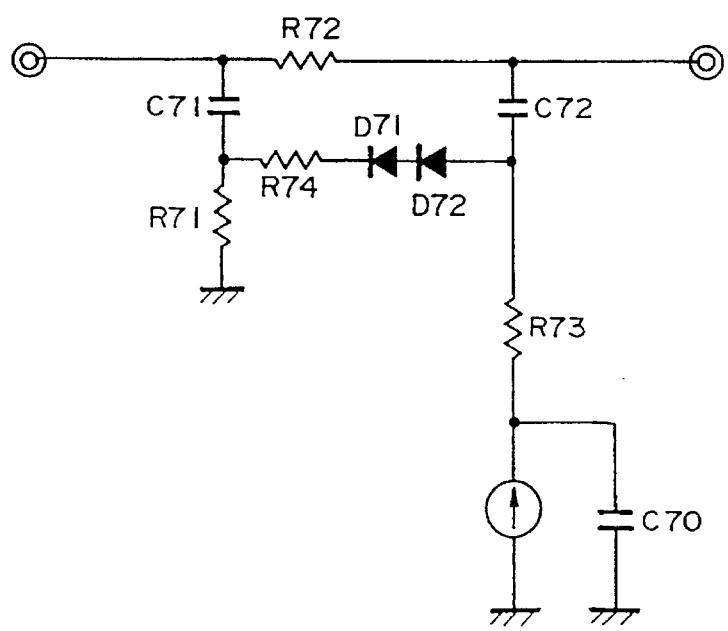
FIG. 12 is a circuit diagram to show an example of arrangement of distortion generating circuit in the second embodiment.
Figure 13:
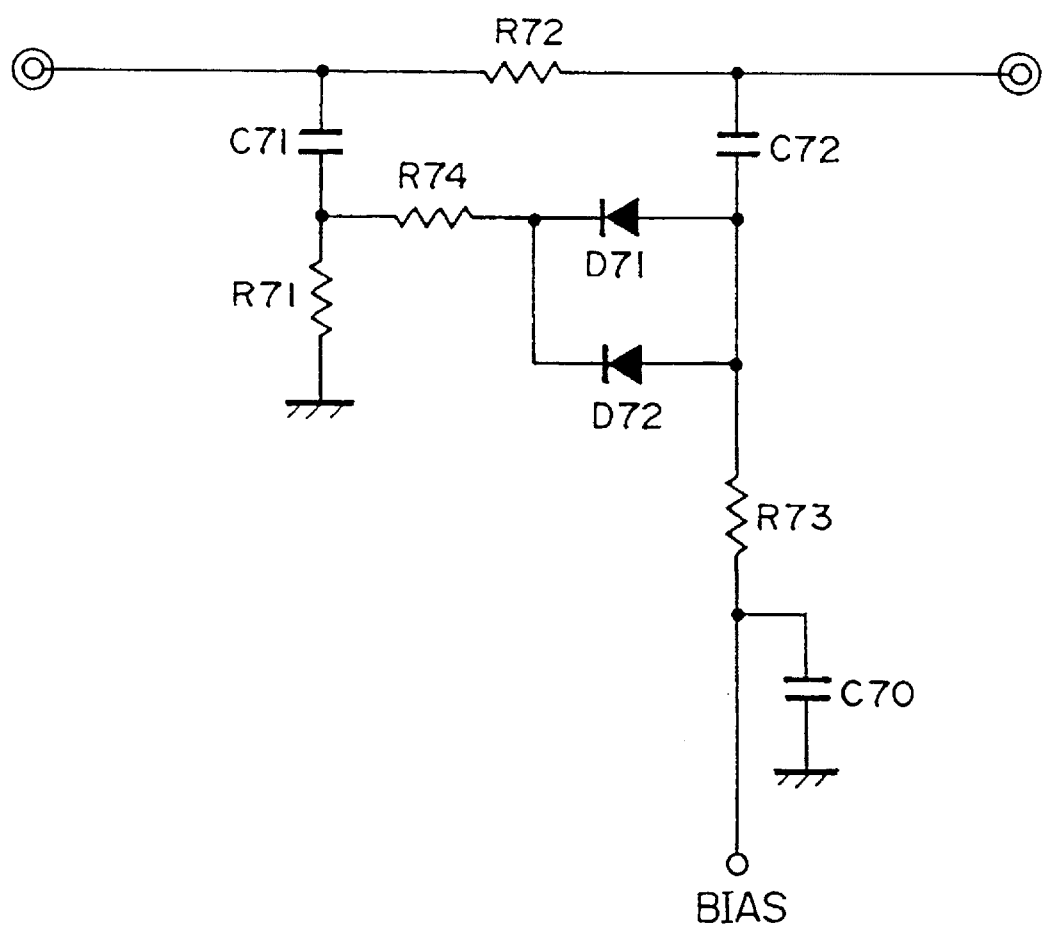
FIG. 13 is a circuit diagram to show an example of arrangement of distortion generating circuit in the second embodiment.

The distortion generated by this circuit can be determined by a level of input signal, the bias and the resistor R74. Therefore, there could be a case in which a proper intercept point cannot be adjusted in case of a signal level being high. In that case, the adjustment can be made possible by connecting two diodes D71, D72 in series as shown in FIG. 12. As the level of input signal becomes higher, more diodes should be connected in series. Also, if the level of input signal is low, the adjustment can be possible by connecting diodes D71, D72 in parallel as shown in FIG. 13. As the level of input signal becomes lower, more diodes should be connected in parallel.

Also, the distortion correcting circuit using only one diode as shown in FIG. 8 has such advantages that it is cheap, excellent in operation stability, and simple in circuit arrangement. However, since the nonlinear characteristics depend upon the V-I characteristics of diode, a third-order distortion component depending upon the V-I characteristics will be simultaneously produced with correction of a second-order distortion component, which could cause a case in which a large second-order distortion component cannot be corrected. Specifically, in case nonlinear distortion of a semiconductor laser which has a larger second-order distortion component than a third-order distortion component is corrected, the third-order distortion could be degraded with correction of the second-order distortion, thus limiting a correctable amount of second-order distortion.

This case can be dealt with by the arrangement as shown in FIG. 13 in which same diodes are connected in parallel so that each diode produces a not-too-large distortion component. Thus, generation of unnecessary third-order distortion can be prevented by decreasing an amount of second-order distortion generated in each diode. In more detail, an amount of third-order distortion is decreased by 2 dB if an amount of second-order distortion generated from the general properties of amplifier or the like is decreased by 1 dB. In this arrangement, the second-order distortion generated by the circuit in FIG. 13 is a sum of those of the two diodes, which makes the third-order distortion relatively smaller while obtaining a necessary amount of second-order distortion.

Figure 14:
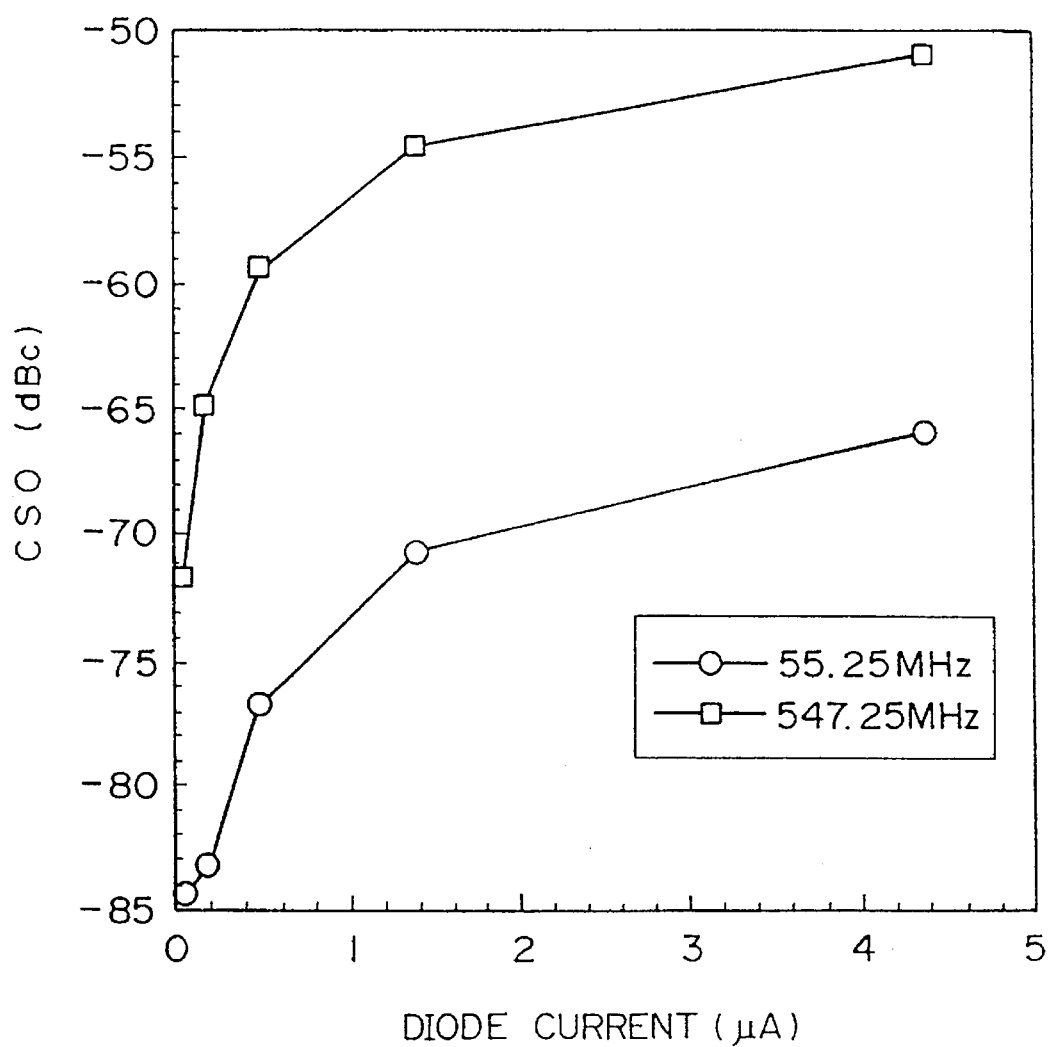
FIG. 14 is a drawing to show current dependency of CSO of the distortion generating circuit shown in FIG. 12;.

FIG. 14 illustrates the diode current dependency of CSO (ISS241) by showing second-order distortion (CSO) produced with a change in bias for a relatively large level of input signal of 35 dBmV. The measurement was conducted using the circuit as shown in FIG. 12. A resistance of the resistor R74 was 75Ω (and the other constants are the same as those in FIG. 8). The input signal was a signal of 80 ch in the range of 55.25 MHz to 547 MHz similarly as in the measurement in FIG. 5. Increasing the bias current through the diodes from 0 μA, the level of second-order distortion was measured (in dBc) for maximum frequency of 547.25 MHz (upper line designating data points with boxes) and for minimum frequency of 55.25 MHz (lower curve designating data points with circles). The measured input RF level was 35 dBmV for 80 channels. As apparent from this result, the generated distortion becomes larger with an increase in frequency.

A reason why the distortion is generated depending upon the frequency is that in case of a junction diode used in band switch, especially in case of a pin diode, the minority carrier contributes to the operation thereof and therefore the phase distortion becomes dominant, whereby high-frequency-range distortion becomes larger than low-frequency-range distortion. Since amplifiers or semiconductor lasers generally have larger distortion in the high frequency range, the distortion correcting circuits in FIG. 8, FIG. 12 and FIG. 13 employ a pin diode to correct the distortion, whereby large distortion is produced in the high frequency region to effect distortion correction.

Figure 15:
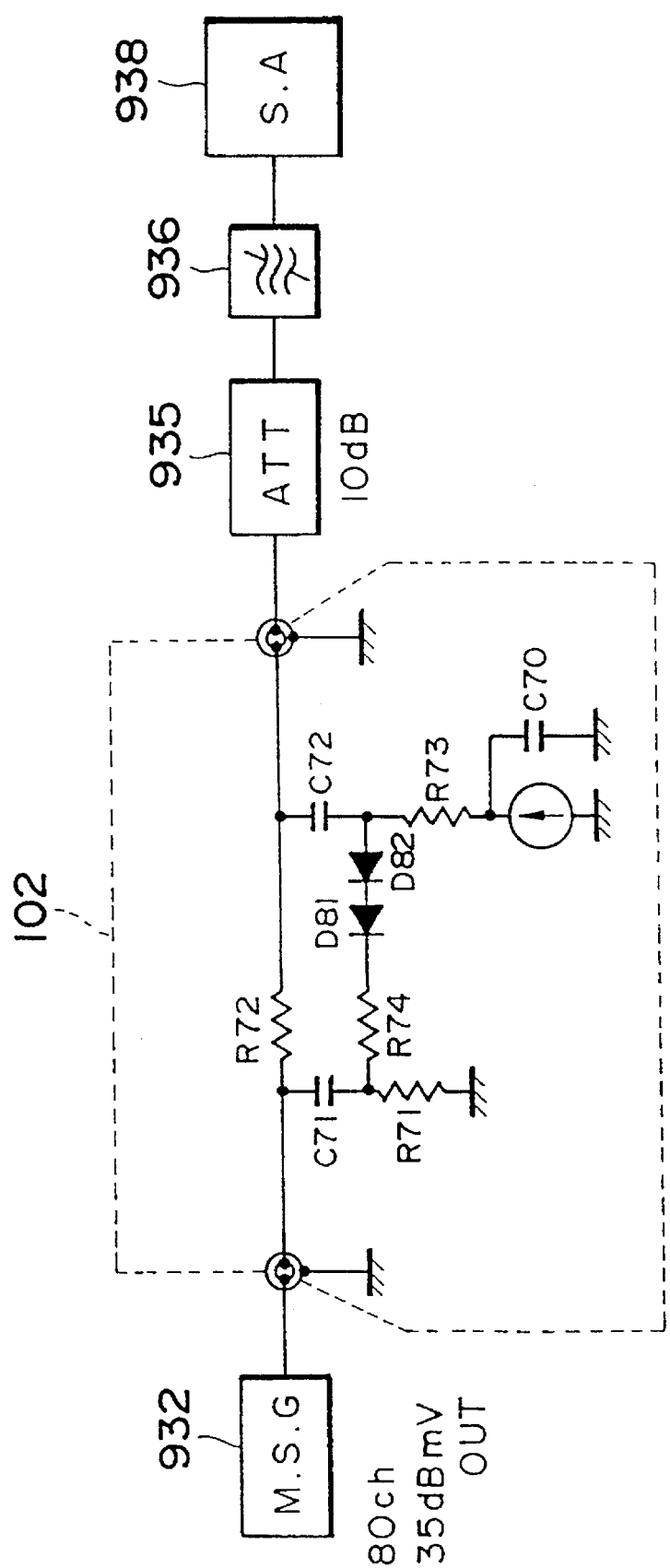
FIG. 15 is a circuit diagram to show an example of arrangement of distortion generating circuit in the second embodiment.

The above description concerns a case in which larger distortion is produced in the high frequency region, but there is a case in which uniform distortion is produced in the entire band. A distortion correcting circuit 102 in FIG. 15 is an example of arrangement for such a case. This circuit 102 has the same arrangement as the circuit in FIG. 12, but is characterized in that the diodes D81, D82 are Schottky diodes (for example MA730 manufactured by MAT-SUSHITA).

Figure 16:
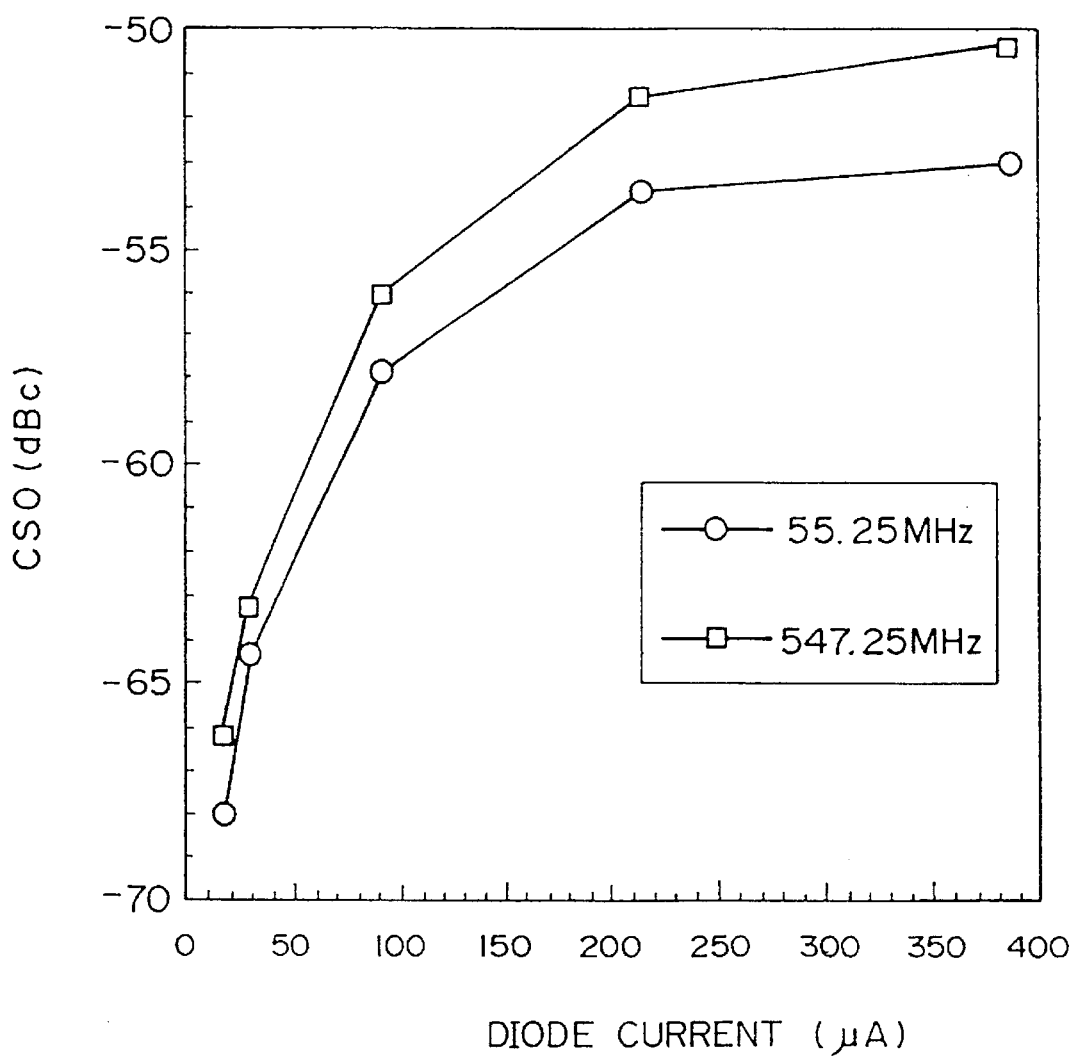
FIG. 16 is a drawing to show current dependency of CSO of the distortion generating circuit shown in FIG. 15.

Using MA730 of Schottky diodes (with resistor R74 of 75Ω and the other arrangement same as that in FIG. 8), a level of second-order distortion was measured (in dBc) by the same measurement system in FIG. 15 in the same manner as described above for maximum frequency of 547 MHz and for minimum frequency of 55.25 MHz while increasing the bias current through the diodes from 0 μA. FIG. 16 illustrates the diode current dependency of CSO (MA730) in which there is no substantial difference between distortion components generated on the high frequency side and on the low frequency side, which are nearly at a same level in the entire frequency range. Like FIG. 14, FIG. 16 shows the minimum of 55.25 MHz (lower curve designating data points with circles) and maximum of 547.25 MHz (upper curve designating data points with boxes), where the input RF level is 35 dBmV for 80 channels.

It is considered that the reason why the generated distortion is nearly uniform in the entire zone is that the majority carrier is dominant in operation of Schottky barrier diode. Accordingly, this arrangement is suitable for distortion correction requiring different specifications from those of the distortion correcting circuits as shown in FIGS. 8, 12 and 13. The distortion correcting circuits in FIG. 8 and in FIG. 13 can be modified in the same manner using a Schottky barrier diode or Schottky barrier diodes.

Figure 17:
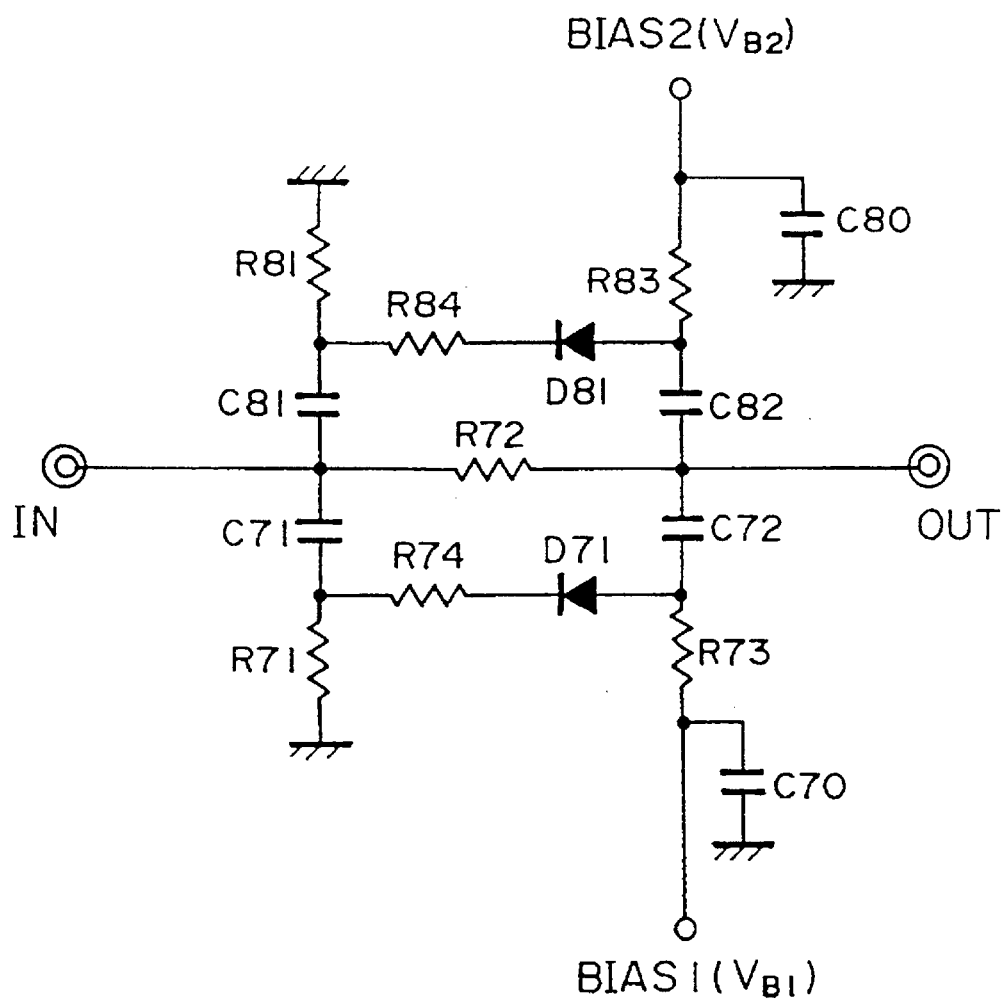
FIG. 17 is a circuit diagram to show an example of arrangement of distortion generating circuit in the second embodiment.

FIG. 17 shows another example of circuit arrangement for more flexible distortion correction.

This circuit is characterized in that a Schottky barrier diode D81 (for example MA730) is connected as a device for generating distortion to the circuit of FIG. 8 as described above in an AC manner in parallel (this arrangement can also be considered as a circuit obtained by connecting a pin diode in parallel with the circuit 102 in FIG. 15). Resistors R71, R73 are connected in an AC manner in parallel to resistors RS1, R83, and resistors R71, R72, R73, RS1, R83 constitute a π attenuator. Capacitors C70, C71, C72, C80, C81, C82 are provided for blocking a direct current and are set to a sufficiently small impedance to an input signal. The resistors R71, R73 also serve as a bias circuit for pin diode D71, the resistors RS1, R83 also serve as a bias circuit for Schottky barrier diode D81, and the resistors R74, R84 adjust operating points of the diodes D71, D81 to an input signal. The operating points of the diodes are arranged as they can be set independently of each other by the resistors R71–R74, the resistors R81–R84 and the biases VB1, VB2 from the outside.

As described above, the pin diode produces larger distortion on the high frequency side than on the low frequency side, while the Schottky barrier diode produces uniform distortion in a wide region. Thus, this circuit produces a sum of distortion components generated by such diodes and outputs it. Accordingly, nearly uniform distortion can be produced in the entire range if the bias point is so set as to make the distortion generated by the Schottky barrier diode dominant, for example. Conversely, if the circuit is arranged such that the distortion produced by the junction diode is dominant, high frequency distortion will be larger than low frequency distortion.

As described, the circuit employs both the pin diode and the Schottky barrier diode and their bias points are properly adjusted, whereby distortion is produced with arbitrary frequency dependency.

Figure 18:
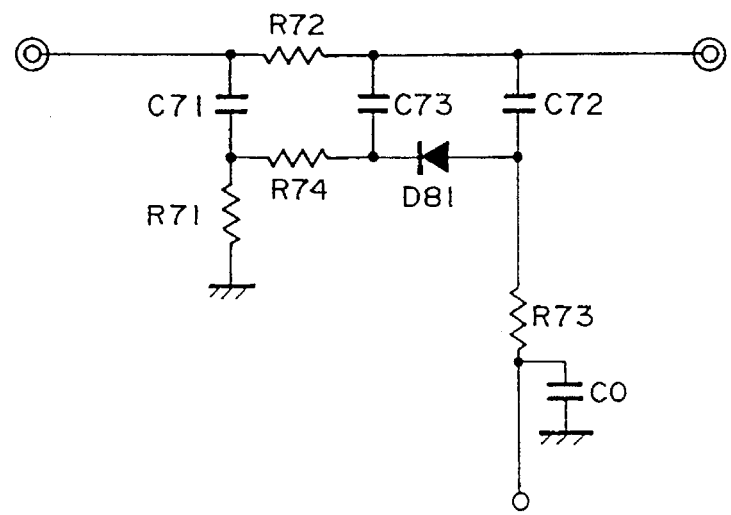
FIG. 18 is a circuit diagram to show an example of arrangement of distortion generating circuit in the second embodiment.
Figure 19:
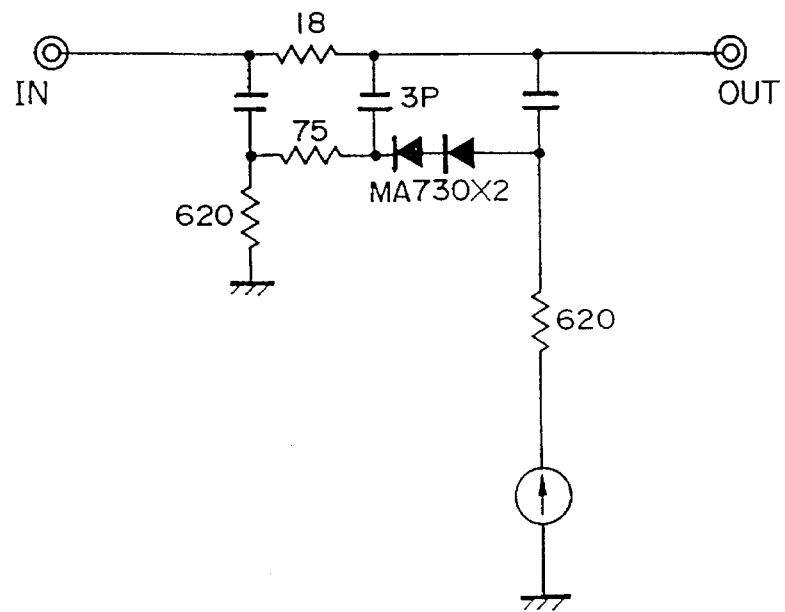
FIG. 19 is a circuit diagram to show an example of arrangement of distortion generating circuit in the second embodiment.

Further, FIG. 18 and FIG. 19 show examples of circuit arrangement for generating distortion with frequency dependency.

The circuit in FIG. 18 is characterized in that a capacitor C73 with a small capacitance (a capacitance of several pF) is connected to the diode in the distortion correcting circuit shown in FIG. 8. The capacitor C73 is connected in parallel with a diode D81 for distortion generation with respect to an AC current, so that high frequency components in the signal to the diode D81 flow into the capacitor 73. This reduces an amount of distortion produced on the high frequency side and higher-order distortion components, and therefore this arrangement is effective for cases in which distortion to be corrected on the high frequency region is small or in which the third-order distortion is desired to be suppressed. Use of this circuit permits correction of distortion with frequency dependency, for example distortion correction with less correction on the high frequency side.

Figure 20:
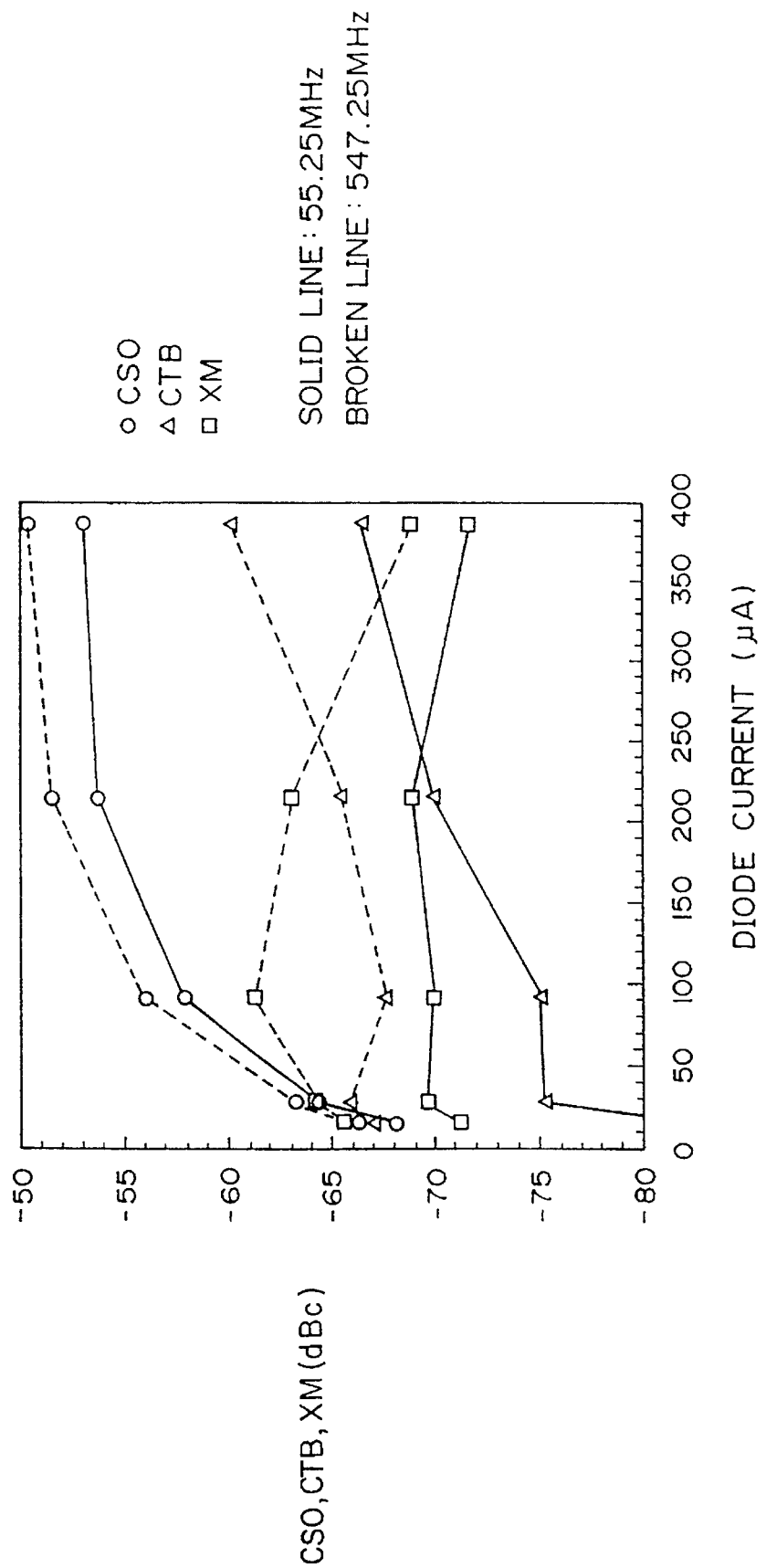
FIGS. 20, 21 and 22 are drawings to show current dependency of CSO, CTB, and XM of the distortion generating circuit shown in FIG. 18.
Figure 21:
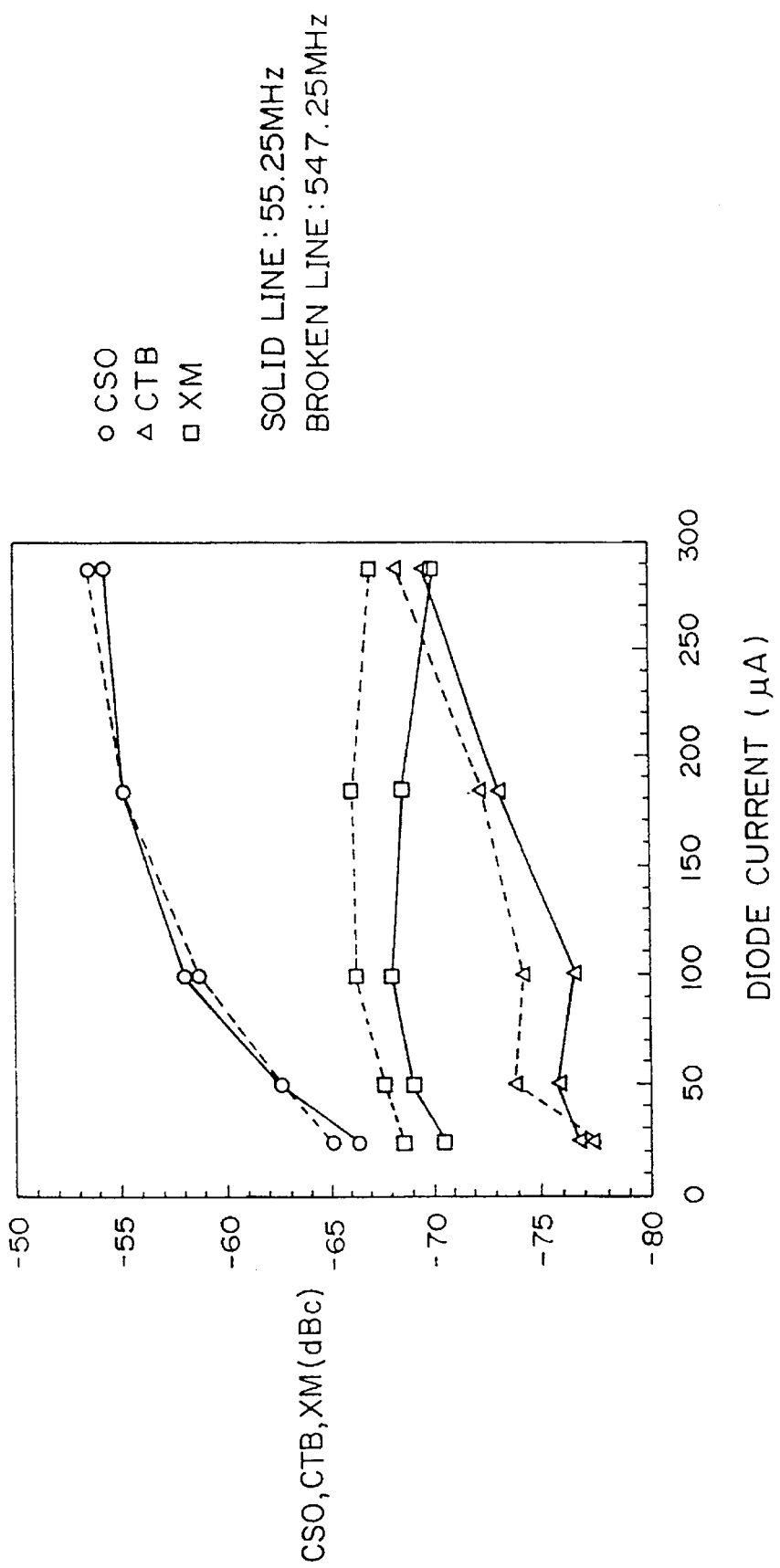
Figure 22:
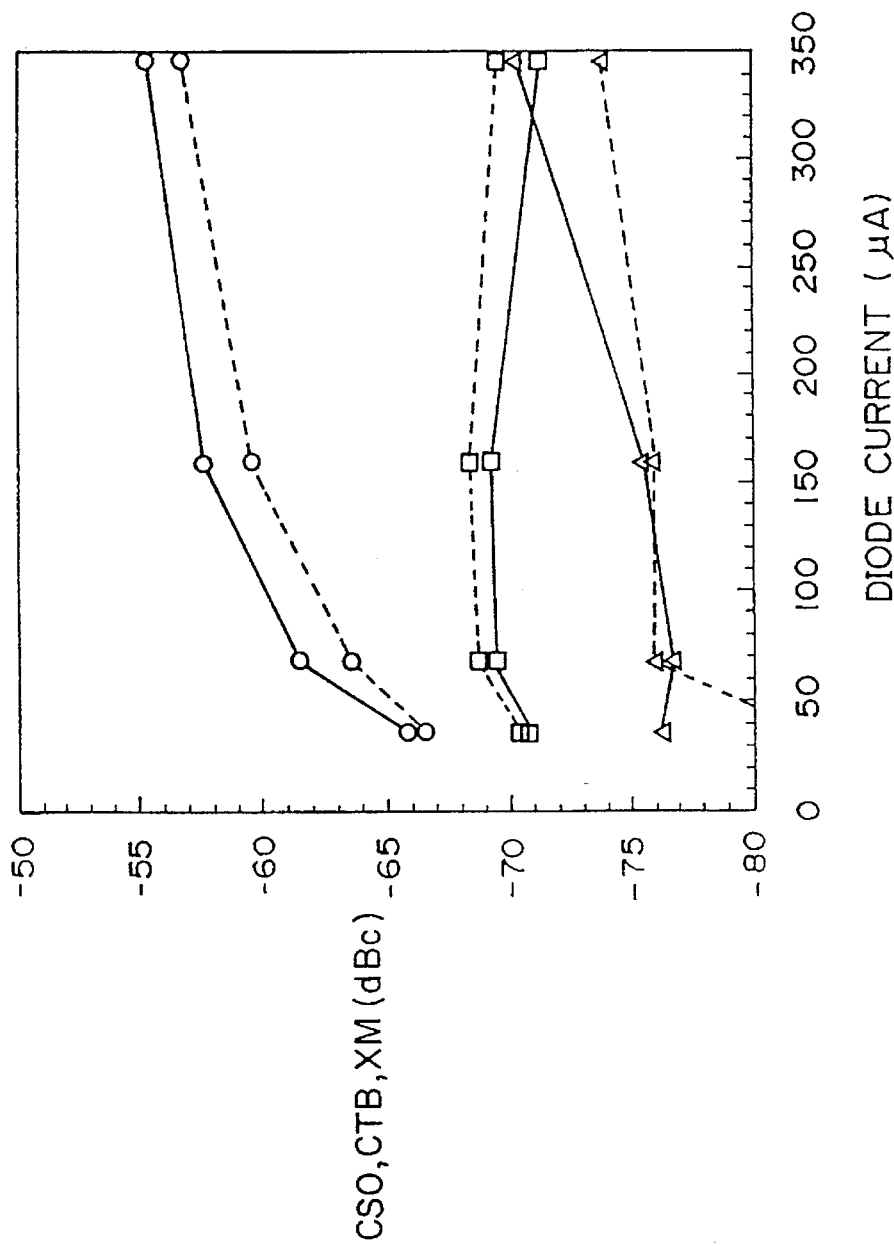

The diode D81 in this circuit can be either a pin diode or a Schottky barrier diode and the diode can be arranged to be connected in series or in parallel as shown in FIG. 12 or in FIG. 13. FIG. 19 shows an example of constants of the circuit, in which two diodes of MA730 are connected in series. FIGS. 20 to 22 compare measurement results with and without third-order distortion controlling capacitor C73.

FIGS. 20–22 show measurement results measured in the same manner as in the measurement of FIG. 15, in which levels of second-order distortion (CSO), curves designating data points with circles, third-order distortion (CTB), curves designating data points with triangles and cross modulation distortion (XM), curves designating data points with squares are shown for frequency 55.25 MHz and for maximum frequency 547.25 MHz with a change in bias current flowing into the diodes. Like FIGS. 14 and 16, the input RF level is 35 dBmV for 80 channels in FIGS. 20–22. FIG. 20 illustrates measurement results of circuits not having a CTB comparator, FIG. 21 circuits having a CTB capacitor of 3 pF, and FIG. 22 circuits having a CTB capacitor of 4 pF. FIG. 20 shows a measurement result without the capacitor C73 in FIG. 19 (which is the circuit shown in FIG. 15), FIG. 21 a measurement result in case of the circuit in FIG. 19, and FIG. 22 a measurement result in case of the circuit arrangement in FIG. 19 employing a capacitor C73 of 4 pF. As apparent from the results, higher-order distortion components are suppressed in the circuit arrangement of FIG. 19 (broken lines in FIGS. 20–22). It is conceivable that the generation of second-order distortion in the high frequency range is mainly caused by sum beats due to carriers in the low frequency region and that the third-order distortion is caused by adjacent beats. As described, this circuit can suppress a generation amount of third-order distortion without lowering a generation amount of second-order distortion too much in the high frequency region. In other words, adding the capacitor in parallel with the diode decreases contribution of nonlinearity of diode in the high frequency region, whereby the third-order distortion can be suppressed without decreasing the generation amount of second order distortion in the high frequency region.

As seen from FIGS. 20–22, the circuit of FIG. 18 is for suppressing the generation of unnecessary third-order distortion in generation of second-order distortion rather than for giving a frequency dependency to the distortion. In this sense, the purpose of the circuit in FIG. 13 is the same as that of this circuit.

Figure 23:
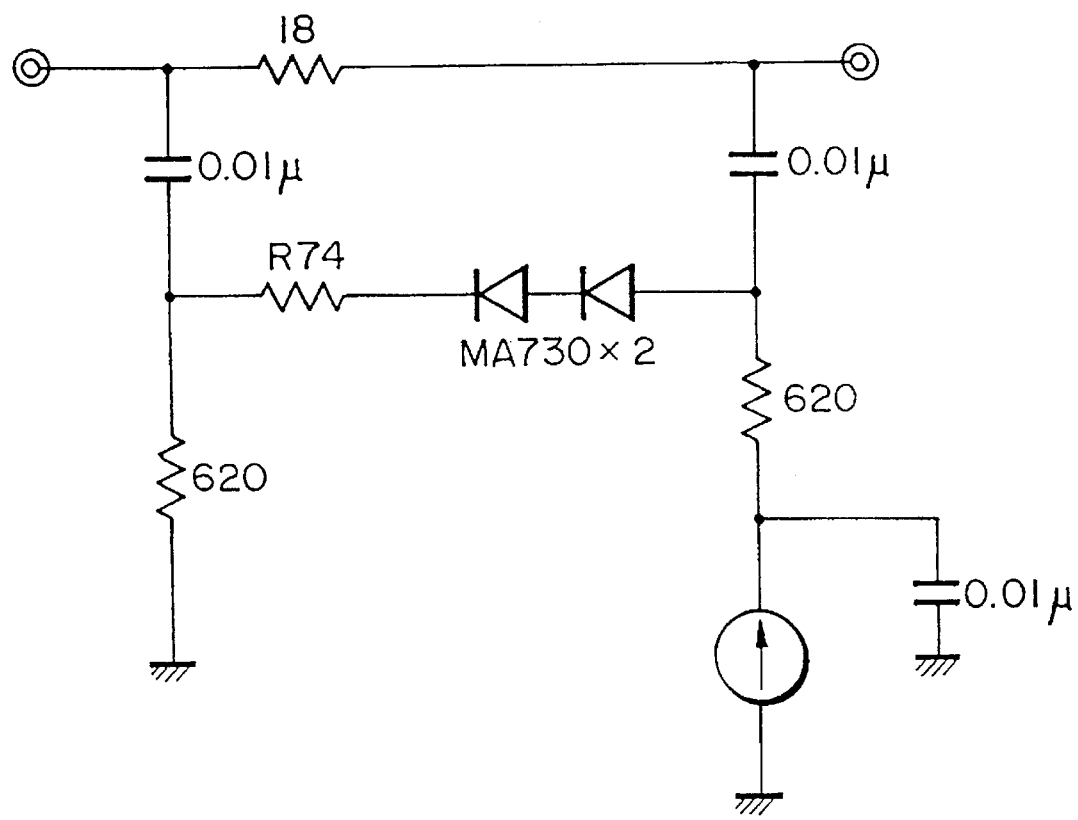
FIG. 23 is a concrete circuit diagram of the distortion generating circuit shown in FIG. 12.
Figure 24:
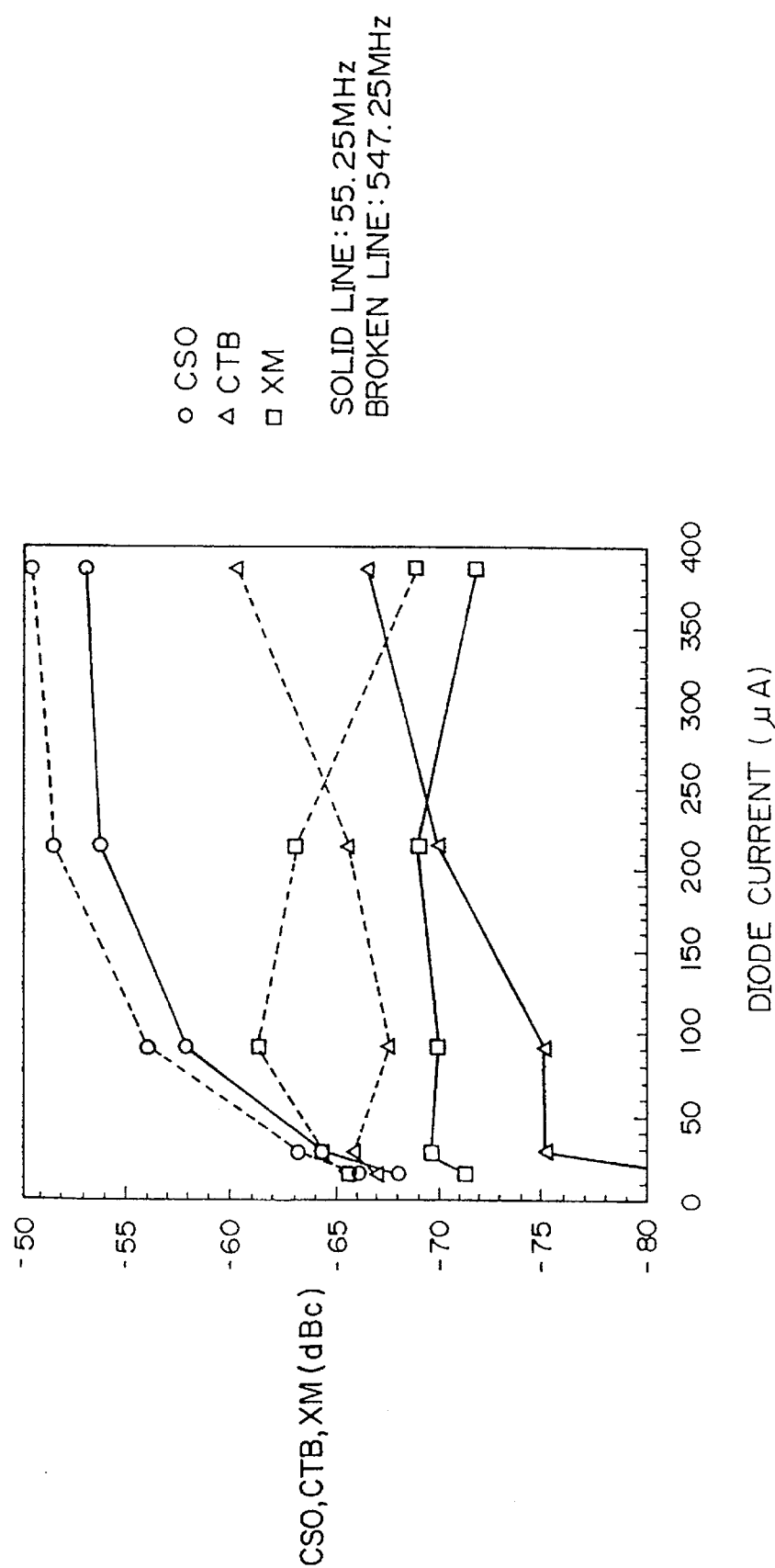
FIG. 24 and FIG. 25 are drawings to show current dependency of CSO, CTB, and XM of the distortion generating circuit shown in FIG. 23.
Figure 25:
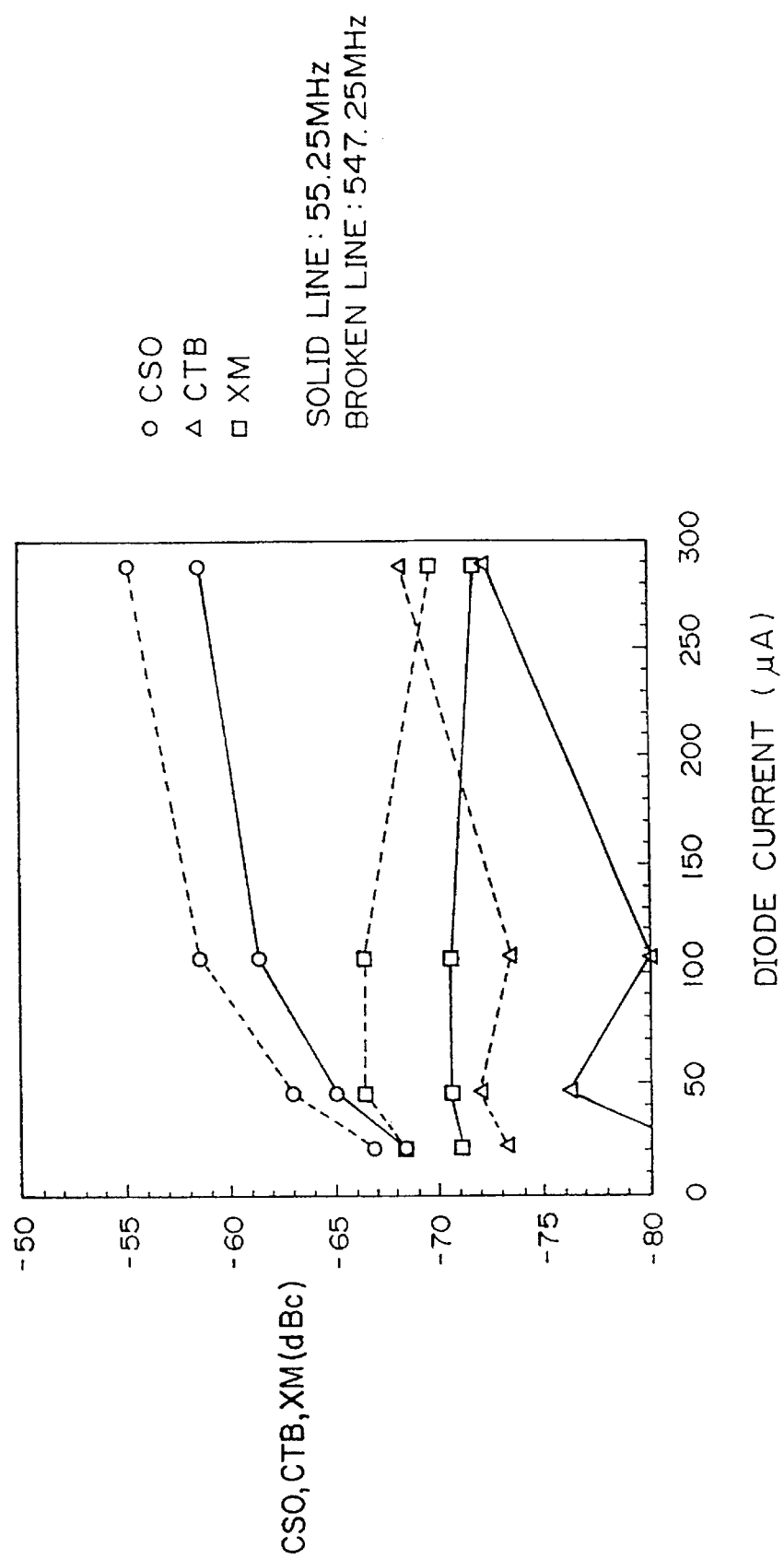

FIG. 23 is a circuit diagram to show a specific example of arrangement for the circuit in FIG. 12, and FIG. 24 and FIG. 25 are drawings to show current dependency of CSO, CTB or XM with the resistor R74 being 75Ω or 150Ω in the circuit of FIG. 23, FIGS. 24–25 using the conventions established in FIGS. 20–22. FIG. 24 relates to a circuit having a diode-serial resistor of 75Ω, and FIG. 25 to a circuit having a diode-serial resistor of 150Ω. From FIGS. 24 and 25, an amount of generated distortion decreases as the resistance of resistor R74 increases. As compared with the results for the capacitor addition, the distortion amount on the low frequency side also decreases similarly as on the high frequency side. Also, a decrease of CTB or XM is greater than that of CSO, which is the same as in the case of capacitor addition.

Figure 26:
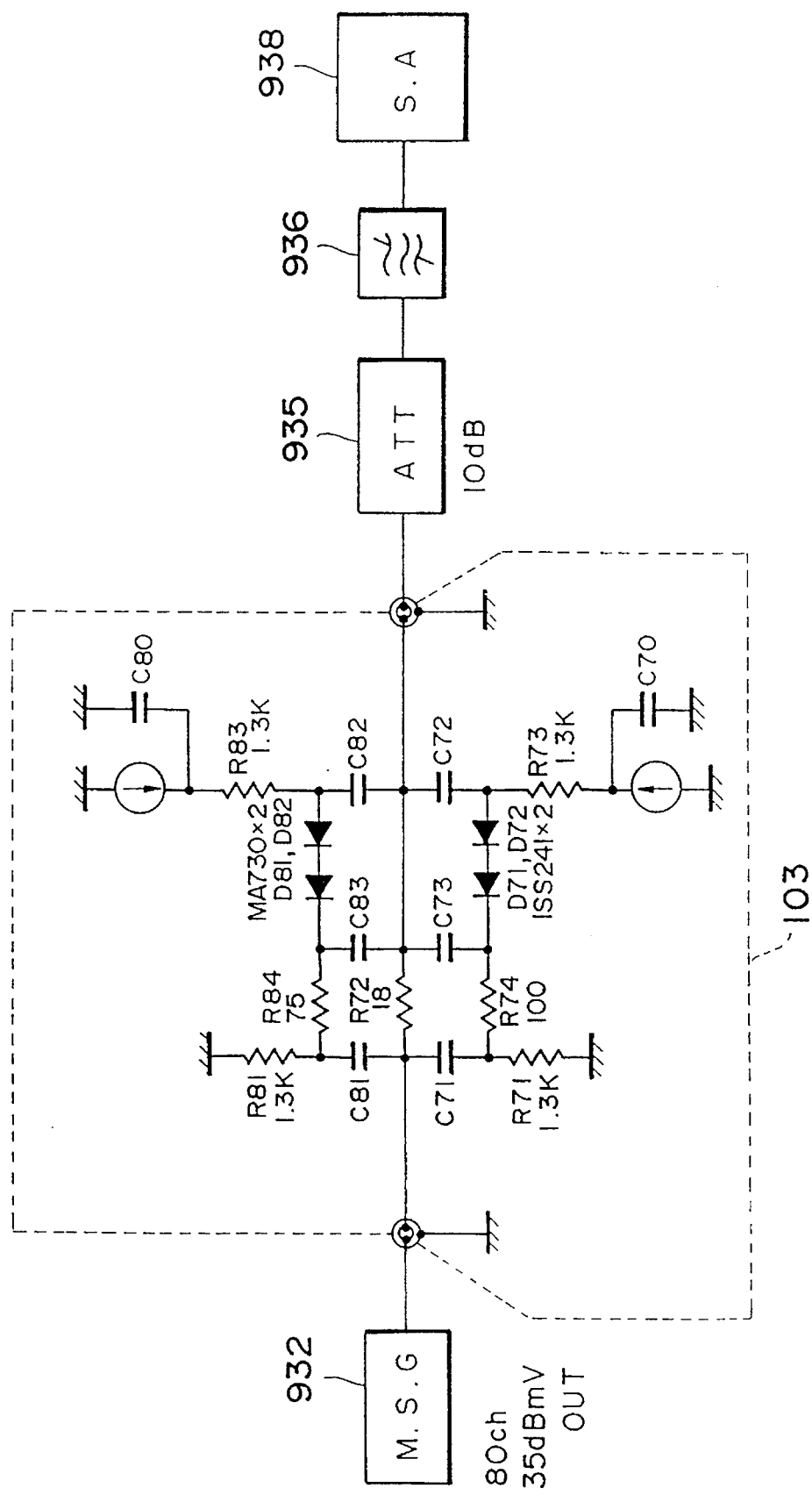
FIG. 26 is a circuit diagram to show an example of arrangement of distortion generating circuit in the second embodiment.

The circuit arrangement in FIG. 18 can be applied to the distortion correcting circuit employing both the pin diode and the Schottky barrier diode as shown in FIG. 17. A circuit 103 in FIG. 26 is an example of such arrangement, in which capacitors C73, C83 are connected to cathodes of pin diodes D71, D72 and Schottky barrier diodes D81, D82. FIG. 26 shows an example of values of resistance in the unit of Ω (which is also employed in the other drawings). Also, a capacitance of capacitors C73, C83 is 3 pF and other capacitors each have a capacitance (for example 0.01 μF) to give a sufficiently small impedance.

Figure 27:
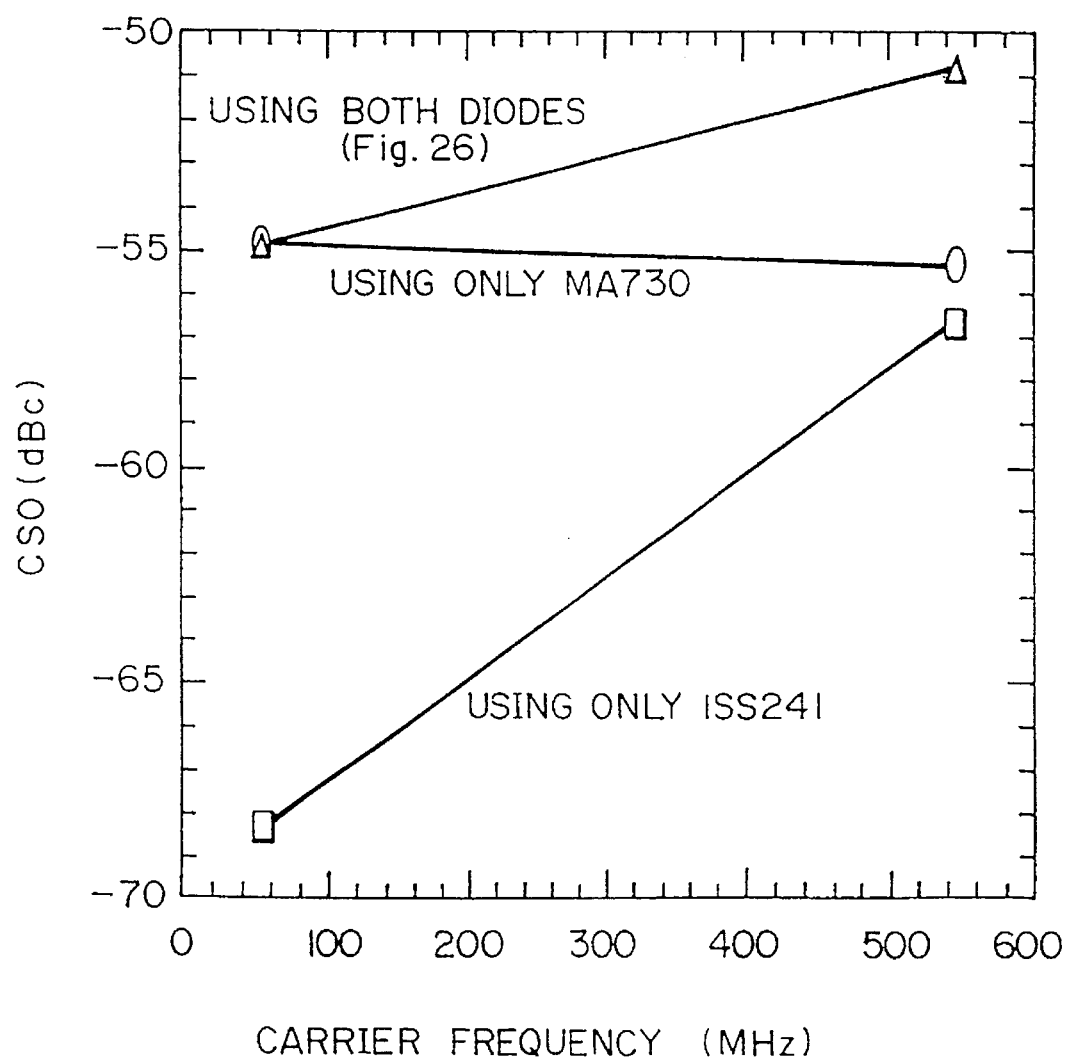
FIG. 27 is a drawing to show CSO of the distortion generating circuit shown in FIG. 26.

FIG. 27 shows comparison of CSO in the same measurement as shown in FIG. 26 for the case of circuit 103 in FIG. 26 and for two cases in which only either pin diodes or Schottky barrier diodes are used in the circuit. Triangular plots represent the case of circuit 103 in FIG. 26. Square plots show the result for the circuit with the pin diodes D71, D72 side of FIG. 26 (corresponding to the circuit in FIG. 12). Circular plots show the result for the circuit with the Schottky barrier diodes D81, D82 side (corresponding to the circuit in FIG. 19). As apparent from the results, the circuit 103 in FIG. 26 can obtain a sum of distortion including distortion components produced by the pin diodes D71, D72 and the Schottky barrier diodes D81, D82, which can be used for correction of distortion which cannot be corrected by the distortion correcting circuits as listed previously.

As described above, distortion correction can be possible in the wide zone by arranging the distortion correcting circuit to employ a diode as a distortion producing device and a resistor attenuator connected in parallel therewith, by further using, as a diode in this circuit, a pin diode, a Schottky diode or a junction diode, by connecting diodes in parallel, or by adding a capacitor in parallel with the diode. Also, in case of correction of semiconductor laser, large second-order distortion can be corrected without degrading the third-order distortion. Further, the distortion correcting circuits in the present invention are arranged in a very simple circuit arrangement to obviate the phase adjusting circuit as employed in the aforementioned conventional example, and have such advantages that the frequency dependency of distortion can be arbitrarily compensated and that large second-order distortion can be corrected. The circuits can be very effective in applications as a circuit for correcting distortion of an optical device such as an amplifier or a semiconductor laser in a frequency multiplexing transmission apparatus in CATV requiring low distortion characteristics in a wide range, for example.

Figure 28:
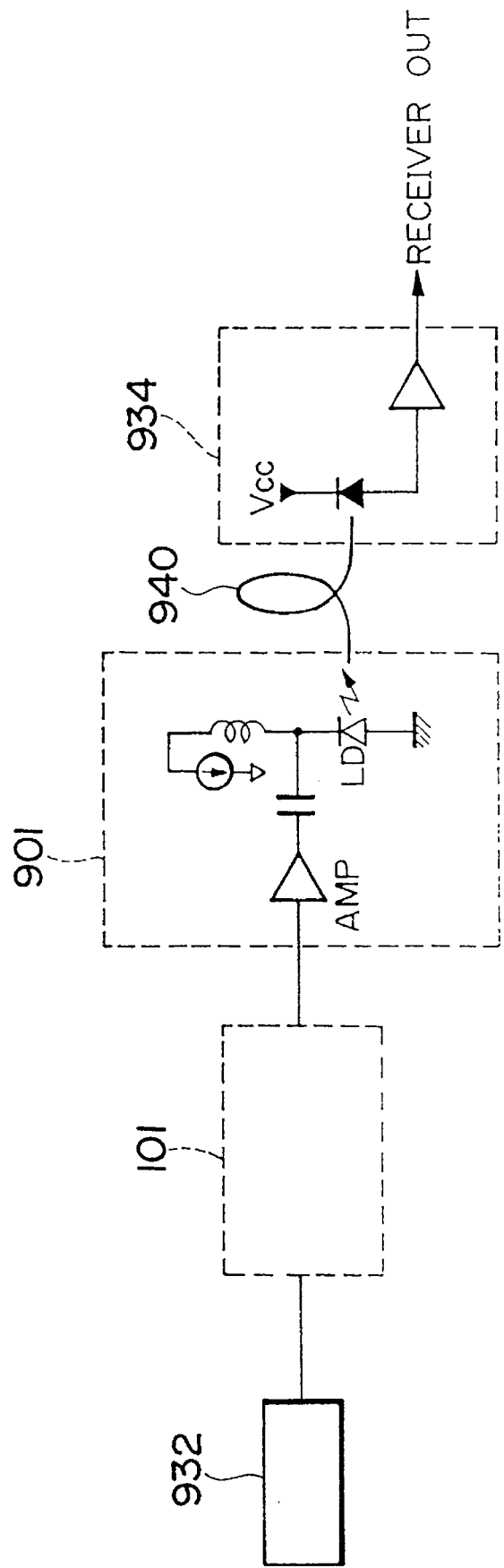
FIG. 28 is a drawing to show an example of arrangement of CATV system using the distortion generating circuit of the present invention.

FIG. 28 shows a first simple example in a frequency multiplexing transmission apparatus in CATV. It is assumed that in this frequency multiplexing transmission apparatus, light generated by a light emitter produces odd-order distortion to a drive signal.

This apparatus is arranged for an optical transmission and has a signal source 932, an optical transmission stage 901, an optical fiber 940 and an optical receiver 934 similarly as an ordinary optical communication apparatus, which is characterized in that the distortion correcting circuit 101 as shown in the first or second embodiment as described above is employed therein. The arrangement is briefly described in the following. The signal source 932 outputs a multiplexed TV signal of about several ten to a hundred channels, and corresponds to MSG as described before. The optical transmission stage 901 converts the multiplexed signal from the signal source 932 into an optical signal and outputs it into the optical fiber 940. A laser diode LD in the transmission stage executes the conversion and output operations of optical signal. In some cases an amplifier may be provided before the laser diode LD to amplify a drive signal thereof up to a level necessary for the drive. The optical fiber 940 transmits the optical signal to the optical receiver 934. Optical couplers are normally set in the optical fiber 940 to distribute the signal to numerous receivers, but are omitted in the drawing. The optical receiver 934 converts the optical signal into an electric signal. A user selects a TV signal of desired channel from the thus received multiplexed signal.

In the CATV system a multiplexed TV signal is transferred to each user and the multiplexed TV signal contains signals ranging from about several ten channels to a hundred and several ten channels. A lot of distortion components are produced by the nonlinearity of elements on the transmission path, which degrades the transmission quality. On the other hand, a demand is to increase transmitting channels, make a transmission distance as long as possible, which could degrade the distortion. Especially, in case of the laser diode LD being driven by a signal with large amplitude, the nonlinearity of the element distorts the optical signal output and the distortion has a frequency dependency.

The distortion correcting circuits of the present invention can flexibly correct the nonlinearity by properly setting the bias point, which can effect correction of distortion with frequency dependency. Thus, using the distortion correcting circuit 101 before the optical transmission stage 901, the nonlinearity of the odd-order distortion can be corrected even with an increased output of the optical transmission stage 901, and the optical receiver 934 can obtain a signal with little distortion. Since the circuits of the present invention can be operated with large input and output, such a circuit may be interposed immediately before the semiconductor laser without an amplifier.

Figure 29:
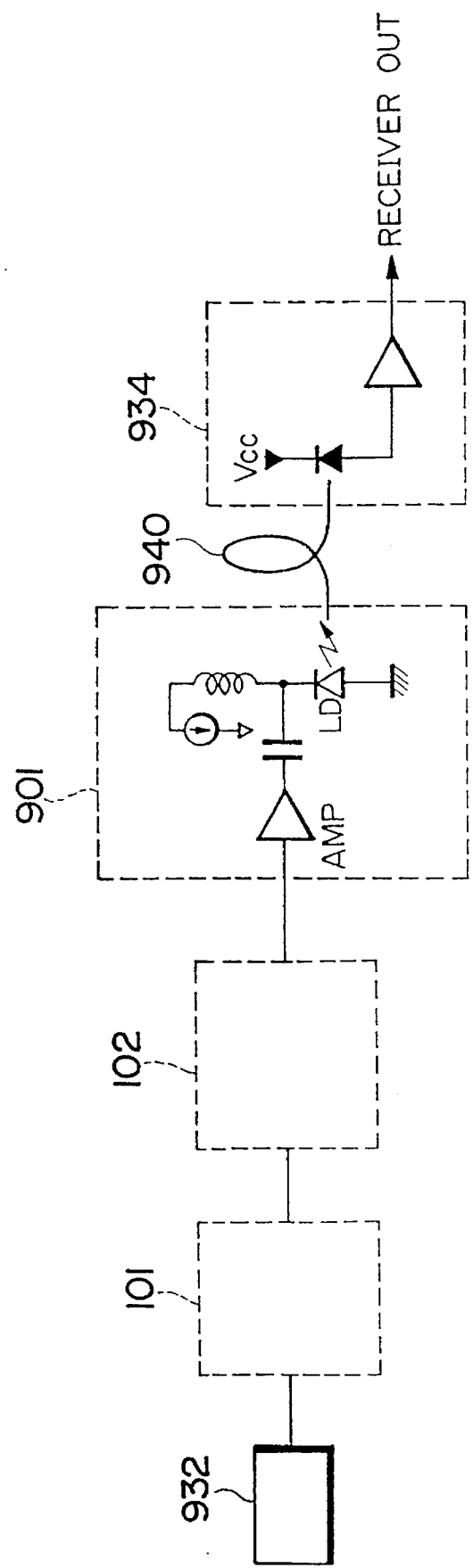
FIG. 29 is a drawing to show an example of arrangement of optical transmitter using the distortion generating circuit of the present invention.

FIG. 29 shows a second simple example in the frequency multiplexing transmission apparatus in CATV. It is assumed that in this frequency multiplexing transmission apparatus a drive signal causes light emitted by a light emitter to have even-order (mainly second-order) distortion and odd-order distortion.

The frequency multiplexing transmission apparatus shown in FIG. 29 is different from the apparatus in FIG. 28 in that an even-order distortion generating circuit 102 for generating even-order (mainly second-order) distortion is added after the odd-order distortion generating circuit 101. The even-order distortion generating circuit of the type as shown in FIG. 15 or in FIG. 16 generates more or less odd-order distortion upon generation of even-order distortion. It is thus preferred that such even-order distortion generating circuit is used at as small input (and output) level as possible and that the odd-order distortion generating circuit 101 is arranged as a preceding stage while the even-order distortion generating circuit 102 as a following stage. Since the circuits of the present invention can be operated with large input and output, they can be inserted right before the semiconductor laser without an amplifier, similarly as the apparatus in FIG. 22.

Figure 30:
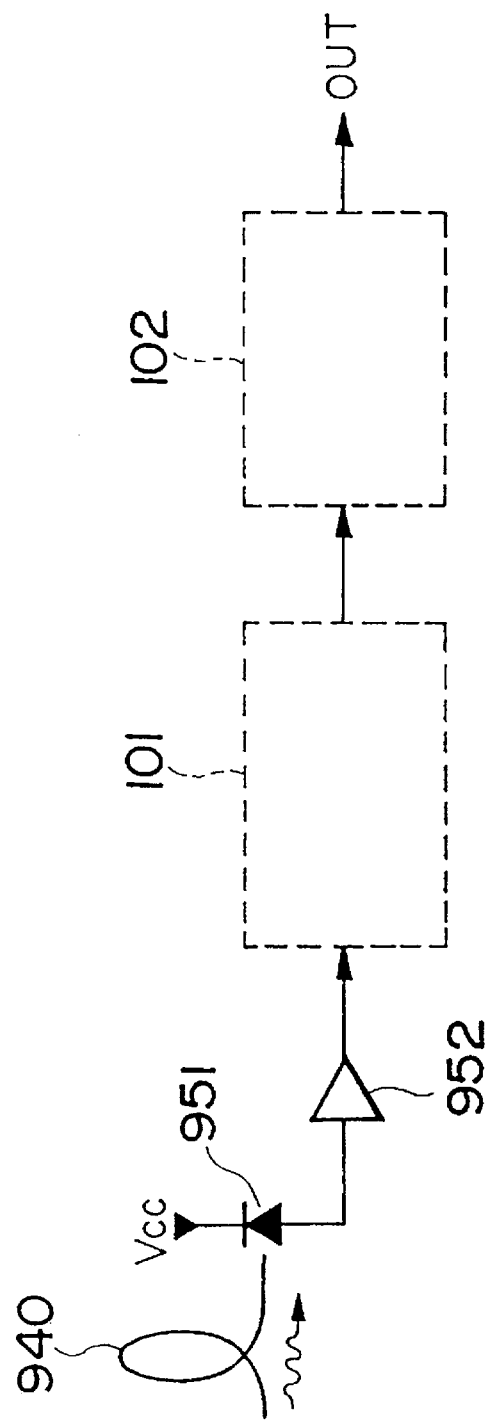
FIG. 30 is a drawing to show an example of arrangement of optical receiver using the distortion generating circuit of the present invention.

The above description concerned the correction of nonlinearity of the light emitter, but such nonlinear distortion is produced also by the optical transmission path, the light receiving element or the amplifier of received optical signal in the frequency multiplexing transmission apparatus. FIG. 30 is a drawing to show an arrangement of an optical receiver which is arranged using the above-described distortion generating circuit in correction of such nonlinear distortion. The optical receiver is composed of a light receiving element 951 for receiving light to convert it into an electric signal, an amplifier 952 for amplifying the electric signal output from the light receiving element 951, an odd-order distortion generating circuit 101 for receiving the signal output from the amplifier 952 to give odd-order distortion to the signal, and an even-order distortion generating circuit 102 for receiving the signal output from the odd-order distortion generating circuit 101 to give even-order distortion to the signal. It is also preferred in this apparatus as in the apparatus in FIG. 29 that the odd-order distortion generating circuit 101 is arranged as a previous stage and the even-order distortion generating circuit 102 as a following stage.

In this optical receiver, the odd-order distortion generating circuit 101 and the even-order distortion generating circuit 102 successively provide nonlinear distortion components which can correct the nonlinear distortion produced by the optical transmission path, the light receiving element or the amplifier of received optical signal, whereby an output signal from the even-order distortion generating circuit 102, which is an output from the optical receiver, can nearly faithfully reproduce the waveform of output light from the optical transmitter.

If the nonlinear distortion generated in the optical transmission path, the light receiving element or the amplifier of received optical signal is substantially only even-order distortion, the odd-order distortion generating circuit 101 in the above optical receiver is unnecessary; if it is substantially only odd-order distortion, the even-order distortion generating circuit 102 in the above optical receiver is unnecessary.

Figure 31:
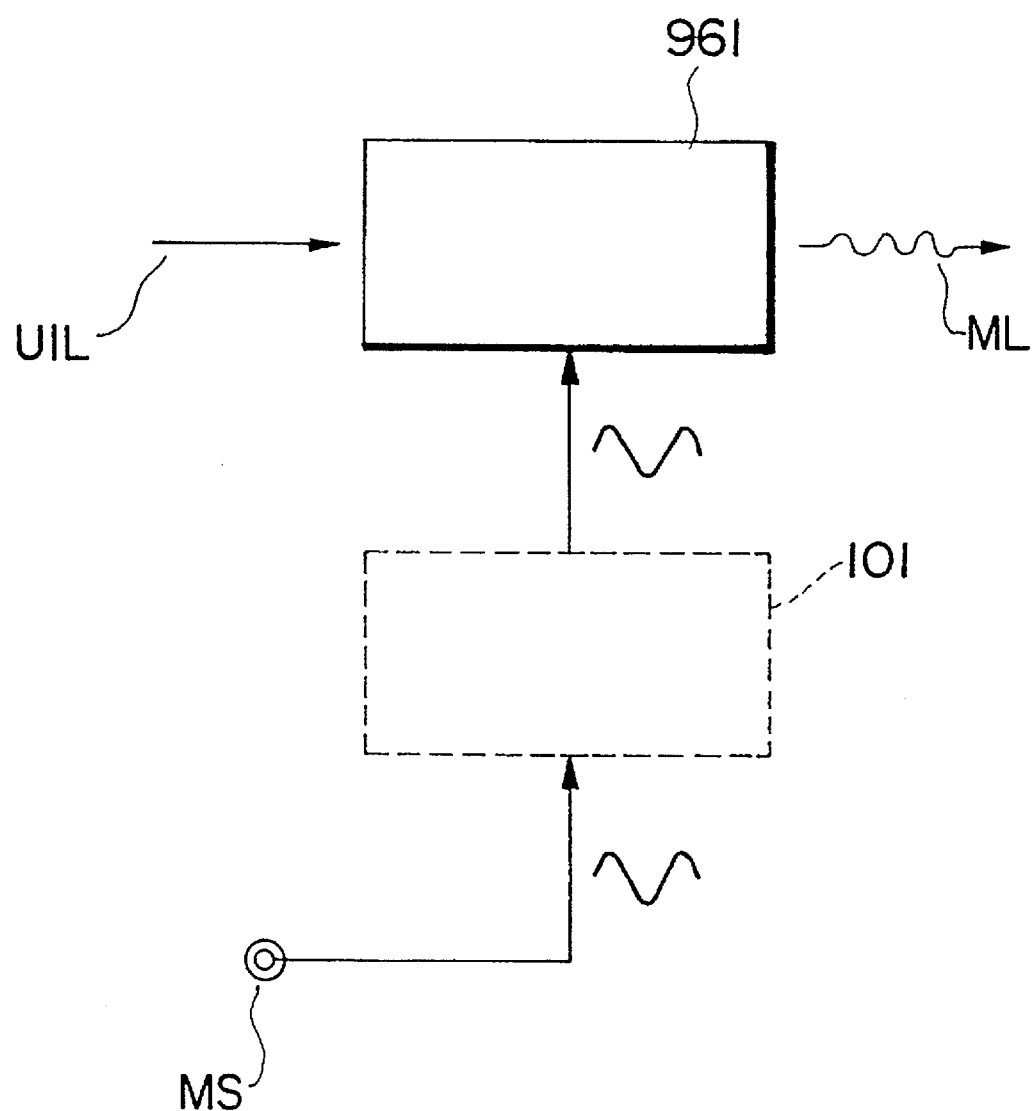
FIG. 31 is a drawing to show an example of arrangement of optical transmitter using the distortion generating circuit of the present invention.

FIG. 31 is a drawing to show an example of arrangement of an optical transmitter of modulated light using a distortion generating circuit of the present invention. The optical transmitter is composed of a Mach-Zehnder optical modulator 961 for receiving unmodulated input light (UIL) and modulating the input light according to a modulation signal (MS) separately input thereinto to output modulated light (ML), and a distortion generating circuit 101 for receiving a modulation signal to give nonlinear distortion to the signal and outputting the distorted modulation signal to the optical modulator 961. The Mach-Zehnder optical modulator generally has a correlation of sine function between an input and an output. Thus, nonlinear distortion generated by the Mach-Zehnder optical modulator is odd-order distortion. In the optical transmitter the distortion generating circuit 101 preliminarily provides odd-order distortion for correcting the odd-order distortion generated by the Mach-Zehnder optical modulator 961. Consequently, the modulated light output from the Mach-Zehnder optical modulator 961 is reduced in nonlinear distortion. The apparatus of FIG. 31 employed the Mach-Zehnder optical modulator as the optical modulator, but the apparatus may employ another type of optical modulator in the use of the odd-order distortion generating circuit, the even-order distortion generating circuit or the both distortion generating circuits of the present invention in accordance with the property of distortion generation specific to the optical modulator, obtaining output light reduced in distortion similarly.

Figure 32:
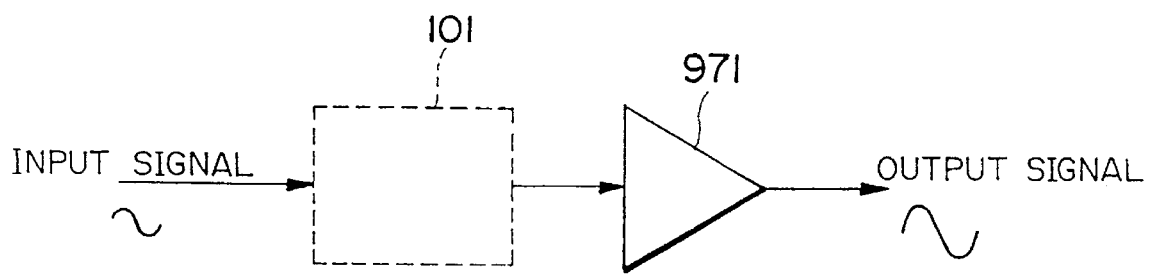
FIG. 32 is a drawing to show an example of arrangement of low-distortion amplifier using the distortion generating circuit of the present invention.

The above description concerned examples of distortion correction in emission of light or in reception of light, but such nonlinear distortion can also be produced in electric transmission or by a circuit. FIG. 32 is a drawing to show an example of arrangement of a low-distortion amplifier using the distortion generating circuit of the present invention. The low-distortion amplifier is composed of a distortion generating circuit 101 for receiving a signal to be amplified and giving odd-order distortion thereto, and a push-pull amplifier 971 for amplifying the signal Output from the distortion generating circuit 101. The push-pull amplifier mainly generates odd-order distortion. Accordingly, the distortion generating circuit 101 provides odd-order distortion for correcting the distortion produced by the push-pull amplifier 971. Consequently, the modulated output from the push-pull amplifier 971 is reduced in nonlinear distortion. Although the apparatus of FIG. 32 employed the push-pull amplifier for generating the odd-order distortion in place of the amplifier, the apparatus can employ another type of amplifier in the use of the odd-order distortion generating circuit, the even-order distortion generating circuit or the both distortion generating circuits of the present invention in accordance with the property of distortion generation specific to the amplifier, obtaining an output signal reduced in distortion similarly. An amplifier generally has a tendency to increase produced distortion with a decrease in dissipation power. Therefore, employing the distortion generating circuit of the present invention, a low-distortion amplifier can be achieved at a low dissipation power.

This circuit has other modifications than the above arrangement. For example, in the circuits as listed previously, the input IN and the output OUT can be exchanged with each other (i.e., the connection can be reversed).

Figure 33:
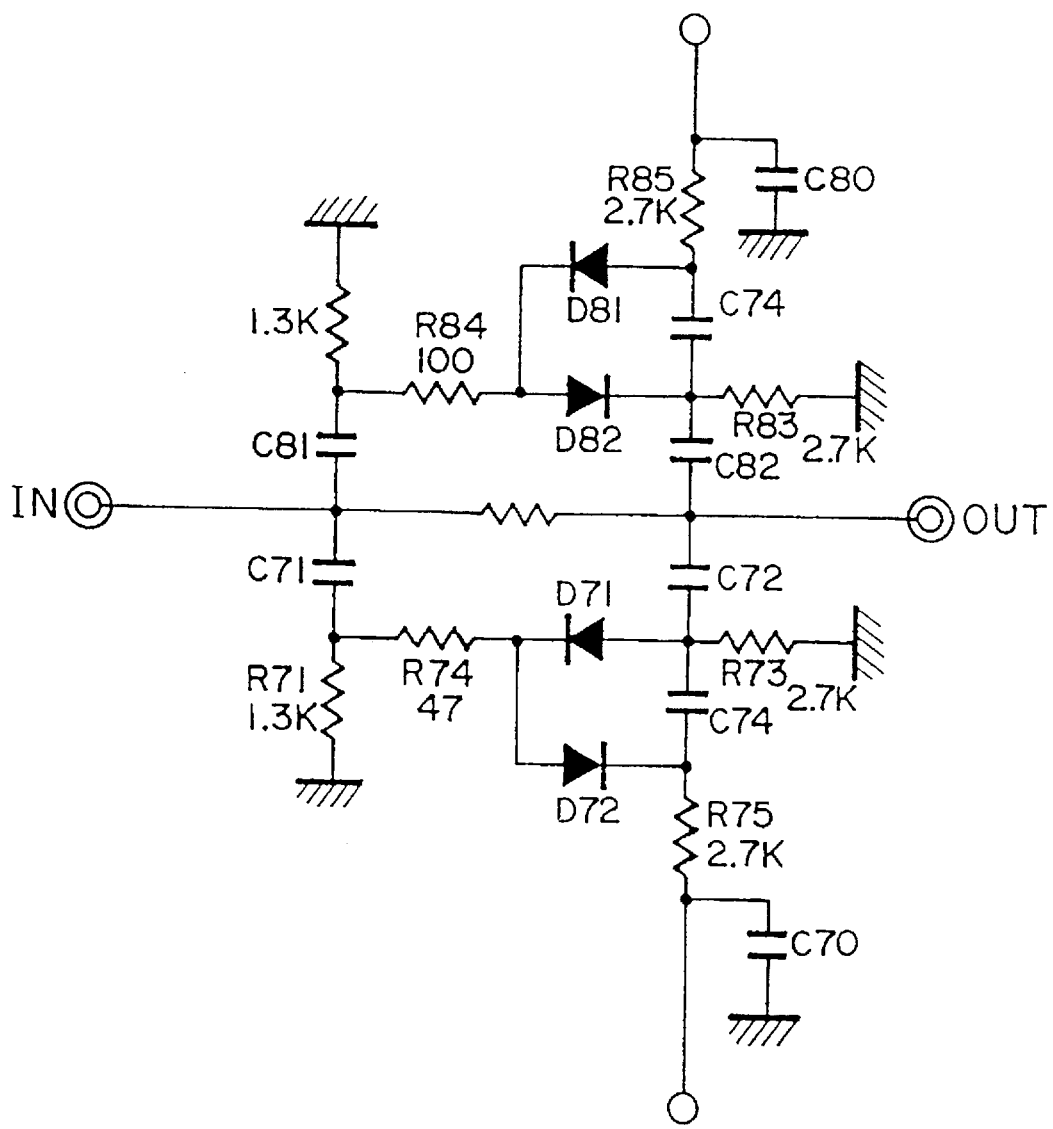
FIG. 33 is a circuit diagram to show an example of arrangement of distortion generating circuit of the present invention.

Also, a circuit can be constructed in a combination of the first embodiment with the second embodiment. FIG. 33 shows such an example. Pin diodes D71, D72 (or Schottky barrier diodes D81, D82) are connected in opposite directions to each other with respect to an AC signal, which is equivalent to the first embodiment if only this portion is seen. The pin diodes D71, D72 are connected in parallel with the Schottky barrier diodes D81, D82 with respect to the AC signal, which is equivalent to FIG. 17 (where the resistors R83, R85, R73, R75 serve as bias circuits for the diodes and as part of the attenuator). This arrangement permits the circuit to have the advantages of the two embodiments as described before. Arranging the third-order distortion correcting circuit with different types of diodes as described, a third-order distortion correcting circuit can be achieved with an arbitrary frequency dependency.

Figure 34:
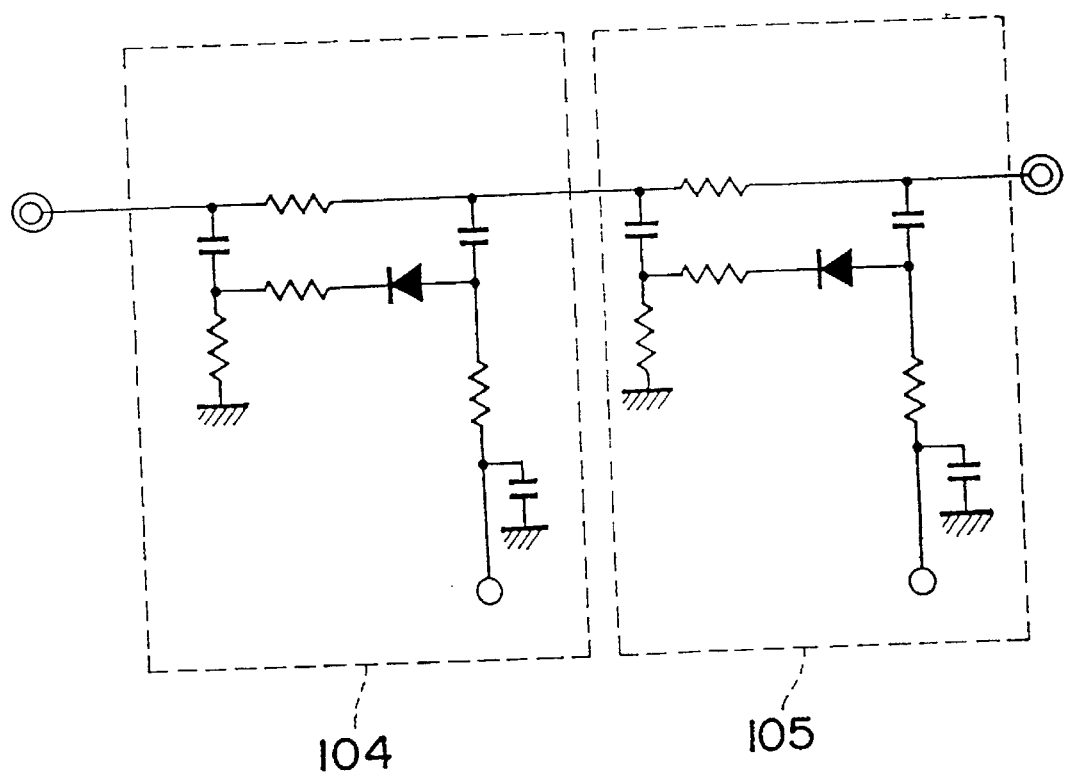
FIG. 34 is a circuit diagram to show an example of arrangement of distortion generating circuit of the present invention.

Further, the same effect can be attained in such an arrangement that the distortion correcting circuits 104, 105 in the above embodiments are connected in series as shown in FIG. 34. Although FIG. 34 shows an example in which the two circuits as shown in FIG. 8 are connected in series, but the two circuits may be replaced by any combination of the circuits as shown in the other drawings, obtaining characteristics according to the employed circuits.

What is claimed is:

1. A distortion generating circuit comprising:
    a linear attenuator which has an input impedance substantially coincident with an impedance of a transmission path for an input signal and an output impedance substantially coincident with an impedance of a transmission path for an output signal;
    at least one diode which is connected in parallel with the linear attenuator and which generates a nonlinear distortion component for said input signal; and
    an adder adding output from said linear attenuator and output from said diode.

2. A distortion generating circuit according to claim 1, further including a resistor connected with a corresponding one of said at least one diode, said resistor and said corresponding diode being connected in parallel with said linear attenuator.

3. A distortion generating circuit according to claim 1, wherein said at least one diode comprises at least one pair of diodes connected in mutually opposite polarities with respect to said input signal into said linear attenuator, said diodes generating odd-order distortion.

4. A distortion generating circuit according to claim 1, wherein said at least one diode generates even-order distortion substantially of second-order or higher-order for said input signal of said linear attenuator otherwise having an even-order distortion after attenuation.

5. A distortion generating circuit according to claim 1, wherein said linear attenuator is arranged to comprise a plurality of resistors.

6. A distortion generating circuit according to claim 4, wherein said linear attenuator is a π resistor attenuator.

7. A distortion generating circuit according to claim 4, wherein said linear attenuator is a T resistor attenuator.

8. A distortion generating circuit according to claim 4, wherein said linear attenuator includes resistors, some of said resistors in said linear attenuator being used in a bias circuit for said diode.

9. A distortion generating circuit according to claim 2, wherein said at least one diode includes two diodes arranged as a pair, bias points for two of said paired diodes being independently adjustable.

10. A distortion generating circuit according to claim 2, wherein said at least one diode includes two diodes arranged in a pair and connected in a direct current manner in series with a bias power supply thereof, bias points of the diodes being adjustable.

11. A distortion generating circuit according to claim 1, wherein at least one of said diodes is a pin diode.

12. A distortion generating circuit according to claim 1, wherein at least one of said diodes is a Schottky diode.

13. A distortion generating circuit according to claim 1, further comprising a capacitor connected in parallel with said at least one diode.

14. A distortion generating circuit according to claim 1, wherein said at least one diode includes multiple diodes which are connected in parallel to each other with respect to the input signal.

15. A distortion generating circuit according to claim 1, wherein said at least one diode includes multiple diodes which comprise a pin diode and a Schottky diode connected in a same polarity with respect to the input signal of said linear attenuator.

16. An optical transmitter comprising:
    a distortion generating circuit generating a distortion generating circuit output by providing an input signal with nonlinear distortion, said distortion generating circuit comprising:
        a linear attenuator which has an input impedance substantially coincident with an impedance of a transmission path for an input signal and an output impedance substantially coincident with an impedance of a transmission path for said distortion generating circuit output,
        at least one diode which is connected in parallel with the linear attenuator and which generates a nonlinear distortion component for said input signal, and
        an adder for adding output from said linear attenuator and said diode; and a light emitting element driven by said distortion generating circuit output.

17. An optical transmitter according to claim 16, wherein said at least one diode comprises:
a first distortion generating circuit including at least one pair of diodes connected in mutually opposite polarities with respect to said input signal of said linear attenuator, said first distortion generating circuit generating a resultant signal by providing said input signal with odd-order distortion; and
a second distortion generating circuit receiving said resultant signal output from said first distortion generating circuit, said second distortion generating circuit generating even-order distortion substantially of second-order or higher-order for said input signal of said linear attenuator when said input signal would otherwise have an even-order distortion after attenuation, wherein
said light emitting element is driven by the signal output from said second distortion generating circuit.

18. An optical transmitter according to claim 16, wherein said light emitting element is a semiconductor laser diode.

19. An optical receiver comprising:
a light receiving element receiving light and generating an electric signal based on said received light; and
a distortion generating circuit receiving said electric signal output from said light receiving element and generating a distortion generating circuit output by providing said electric signal with nonlinear distortion, said distortion generating circuit comprising:
a linear attenuator which has an input impedance substantially coincident with an impedance of a transmission path for said received electric signal and an output impedance substantially coincident with an impedance of a transmission path for said distortion generating circuit output,
at least one diode which is connected in parallel with the linear attenuator and which generates a nonlinear distortion component for said received electric signal, and
an adder for adding output from said linear attenuator and said diode.

20. An optical receiver according to claim 19, comprising:
a light receiving element receiving light and generating an electric signal based on said received light;
a first distortion generating circuit receiving said electric signal output from said light receiving element and generating a first distortion generating circuit output by providing said received electric signal with odd-order distortion, said first distortion generating circuit comprising at least one pair of diodes that are connected in mutually opposite polarities with respect to said received electric signal, said diodes generating said odd-order distortion; and
a second distortion generating circuit receiving said first distortion generating circuit output and providing the signal with even-order distortion, said second distortion generating circuit generating said even-order distortion substantially of second-order or higher-order for said electric signal when said electric signal would otherwise have an even-order distortion after attenuation.

21. An optical transmitter for outputting modulated light from unmodulated input light, comprising:
a distortion generating circuit receiving a modulation signal and generating a distortion generating circuit output by providing said modulation signal with non-linear distortion, said distortion generating circuit comprising:
a linear attenuator which has an input impedance substantially coincident with an impedance of a transmission path for said received modulation signal and an output impedance substantially coincident with an impedance of a transmission path for said distortion generating circuit output,
at least one diode which is connected in parallel with the linear attenuator and which generates a nonlinear distortion component for said received modulation signal, and
an adder for adding output from said linear attenuator and said diode; and
an optical modulator for generating modulated light based on said unmodulated input light and said distortion generating circuit output.

22. An optical transmitter according to claim 21, wherein said at least one diode comprises:
a first distortion generating circuit including at least one pair of diodes connected in mutually opposite polarities with respect to said modulation signal received by said linear attenuator, said first distortion generating circuit generating a resultant signal by providing said received modulation signal with odd-order distortion; and
a second distortion generating circuit receiving said resultant signal output from said first distortion generating circuit and providing the signal with even-order distortion, said second distortion generating circuit generating said even-order distortion substantially of second-order or higher-order for said modulation signal received by said linear attenuator when said modulation signal would otherwise have even-order distortion after attenuation, wherein
said optical modulator generates modulated light based on output from said second distortion generating circuit.

23. A low-distortion amplifier comprising:
a distortion generating circuit generating a distortion generating circuit output by providing an input signal with nonlinear distortion, said distortion generating circuit comprising:
a linear attenuator which has an input impedance substantially coincident with an impedance of a transmission path for an input signal and an output impedance substantially coincident with an impedance of a transmission path for said distortion generating circuit output,
at least one diode which is connected in parallel with the linear attenuator and which generates a nonlinear distortion component for said input signal, and
an adder for adding output from said linear attenuator and said diode; and
an amplifier for amplifying said distortion generating circuit output.

24. A low-distortion amplifier according to claim 23, comprising:
a first distortion generating circuit including at least one pair of diodes connected in mutually opposite polarities with respect to said input signal of said linear attenuator, said first distortion generating circuit generating a resultant signal by providing said input signal with odd-order distortion; and
a second distortion generating circuit receiving said resultant signal output from said first distortion generating circuit, said second distortion generating circuit generating even-order distortion substantially of second-order or higher-order for said input signal of said linear attenuator when said input signal would otherwise have an even-order distortion after attenuation, wherein said amplifier amplifying output from said second distortion generating circuit.

* * * * *